US012751059B2

(12) United States Patent
Nagai et al.

(10) Patent No.: US 12,751,059 B2
(45) Date of Patent: Sep. 29, 2026

(54) SEMICONDUCTOR DEVICE WITH METAL SILICIDE LAYER AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventors: Masatsugu Nagai, Nomi Ishikawa (JP); Kazuyuki Sato, Nonoichi Ishikawa (JP); Shingo Sato, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 532 days.

(21) Appl. No.: 18/166,230

(22) Filed: Feb. 8, 2023

(65) Prior Publication Data

US 2024/0038850 A1 Feb. 1, 2024

(30) Foreign Application Priority Data

Jul. 29, 2022 (JP) ................................. 2022-121204

(51) Int. Cl.
*H10D 62/60* (2025.01)
*H10D 30/01* (2025.01)
(Continued)

(52) U.S. Cl.
CPC ........... *H10D 62/60* (2025.01); *H10D 30/025* (2025.01); *H10D 30/63* (2025.01); *H10D 62/83* (2025.01);
(Continued)

(58) Field of Classification Search
CPC ...... H10D 62/60; H10D 30/025; H10D 30/63; H10D 62/83; H10D 30/66; H10D 30/0295;
(Continued)

(56) References Cited

U.S. PATENT DOCUMENTS 4,987,098 A * 1/1991 Nishiura ................ H10D 30/66
257/E29.198
6,153,495 A 11/2000 Kub et al.
(Continued)

FOREIGN PATENT DOCUMENTS

JP H08-172183 A 7/1996
JP H08-274310 A 10/1996
(Continued)

OTHER PUBLICATIONS

Notice of Reasons for Refusal (Office Action) mailed Aug. 5, 2025 in corresponding Japanese Patent Application No. 2022-121204, with English machine translation, 19 pages.
(Continued)

*Primary Examiner* — Mohammad M Hoque
(74) *Attorney, Agent, or Firm* — Kim & Stewart LLP

(57) ABSTRACT

A semiconductor device of embodiments includes: a first electrode; a second electrode; a semiconductor layer provided between the first electrode and the second electrode, having a first face and a second face, and containing silicon; a first semiconductor region of n-type; a second semiconductor region of p-type disposed the first semiconductor region and the first face; a third semiconductor region of n-type between the second semiconductor region and the first face; a gate electrode facing the second semiconductor region; and a metal silicide layer between the first electrode and the second semiconductor region and between the first electrode and the third semiconductor region, including a
(Continued)

top surface, a first bottom surface in contact with the third semiconductor region, and containing gold or a platinum group element. The n-type impurity concentration in the third semiconductor region monotonically decreases from the first bottom surface toward the second electrode.

8 Claims, 28 Drawing Sheets

(51) Int. Cl.

| | |
|---|---|
| ***H10D 30/63*** | (2025.01) |
| ***H10D 62/83*** | (2025.01) |
| ***H10P 14/40*** | (2026.01) |
| ***H10P 32/10*** | (2026.01) |
| ***H10P 32/14*** | (2026.01) |
| ***H10P 50/28*** | (2026.01) |
| ***H10P 95/90*** | (2026.01) |

(52) U.S. Cl.
CPC ........ *H10P 14/412* (2026.01); *H10P 32/1406* (2026.01); *H10P 32/171* (2026.01); *H10P 50/283* (2026.01); *H10P 95/90* (2026.01)

(58) Field of Classification Search
CPC .... H10D 30/668; H10D 64/01; H10D 64/256; H10D 62/111; H10D 62/153; H10D 62/393; H10D 64/62; H10D 62/124; H01L 21/2253; H01L 21/31111; H01L 21/32051; H01L 21/324; H01L 21/28518
USPC .......................................................... 257/655
See application file for complete search history.

(56) References Cited

U.S. PATENT DOCUMENTS

| | | | | |
|---|---|---|---|---|
| 6,194,290 | B1 | 2/2001 | Kub et al. | |
| 6,274,892 | B1 | 8/2001 | Kub et al. | |
| 6,646,304 | B1 | 11/2003 | Tihanyi et al. | |
| 2012/0241854 | A1* | 9/2012 | Ohta | H10D 62/154 438/270 |
| 2014/0070369 | A1 | 3/2014 | Kitamura | |
| 2015/0228736 | A1 | 8/2015 | Sakakibara | |
| 2017/0077285 | A1* | 3/2017 | Uehara | H10D 62/8325 |
| 2018/0233564 | A1* | 8/2018 | Kumada | H10D 12/031 |
| 2018/0350962 | A1* | 12/2018 | Naito | H10D 12/481 |
| 2019/0131443 | A1 | 5/2019 | Hoshi et al. | |
| 2019/0252199 | A1 | 8/2019 | Matsuo et al. | |
| 2021/0043458 | A1 | 2/2021 | Fujino | |
| 2021/0280680 | A1* | 9/2021 | Xu | H10D 64/513 |
| 2021/0288147 | A1* | 9/2021 | Shimizu | H10D 62/8325 |
| 2021/0288158 | A1 | 9/2021 | Shimizu | |
| 2021/0296513 | A1 | 9/2021 | Sano et al. | |
| 2022/0013639 | A1 | 1/2022 | Tanaka et al. | |
| 2022/0115238 | A1 | 4/2022 | Tajima et al. | |
| 2022/0149150 | A1* | 5/2022 | Imagawa | H10D 12/481 |
| 2023/0378340 | A1 | 11/2023 | Kikuchi et al. | |
| 2024/0136353 | A1* | 4/2024 | Dainese | H10D 12/481 |

FOREIGN PATENT DOCUMENTS

| | | | |
|---|---|---|---|
| JP | H08-274311 | A | 10/1996 |
| JP | 2014-056946 | A | 3/2014 |
| JP | 2015043458 | A * | 3/2015 |
| JP | 2015153781 | A | 8/2015 |
| JP | 2018133377 | A | 8/2018 |
| JP | 2019129300 | A | 8/2019 |
| JP | 2021-027229 | A | 2/2021 |
| JP | 2021012995 | A | 2/2021 |
| JP | 2021-150552 | A | 9/2021 |
| JP | 2021145112 | A | 9/2021 |
| JP | 6970263 | B2 | 11/2021 |
| JP | 2022016286 | A | 1/2022 |
| JP | 2022-063074 | A | 4/2022 |
| JP | 2023-170953 | A | 12/2023 |
| WO | 99/46809 | A1 | 9/1999 |
| WO | 99/53549 | A1 | 10/1999 |
| WO | 2018135147 | A1 | 7/2018 |
| WO | 2019/239448 | A1 | 12/2019 |

OTHER PUBLICATIONS

Notice of Reasons for Refusal (Office Action) mailed Nov. 11, 2025 in corresponding Japanese Patent Application No. 2022-121204, with English machine translation, 9 pages.

* cited by examiner

SEMICONDUCTOR DEVICE WITH METAL SILICIDE LAYER AND METHOD FOR MANUFACTURING THE SAME

CROSS-REFERENCE TO RELATED APPLICATION

This application is based upon and claims the benefit of priority from Japanese Patent Application No. 2022-121204, filed on Jul. 29, 2022, the entire contents of which are incorporated herein by reference.

FIELD

Embodiments described herein relate generally to a semiconductor device and a semiconductor device manufacturing method.

BACKGROUND

In a metal oxide semiconductor field effect transistor (MOSFET), it is desired to reduce the contact resistance between the electrode and the semiconductor region. By reducing the contact resistance between the electrode and the semiconductor region, the on-resistance of the MOSFET is reduced.

DETAILED DESCRIPTION

Figure 1:
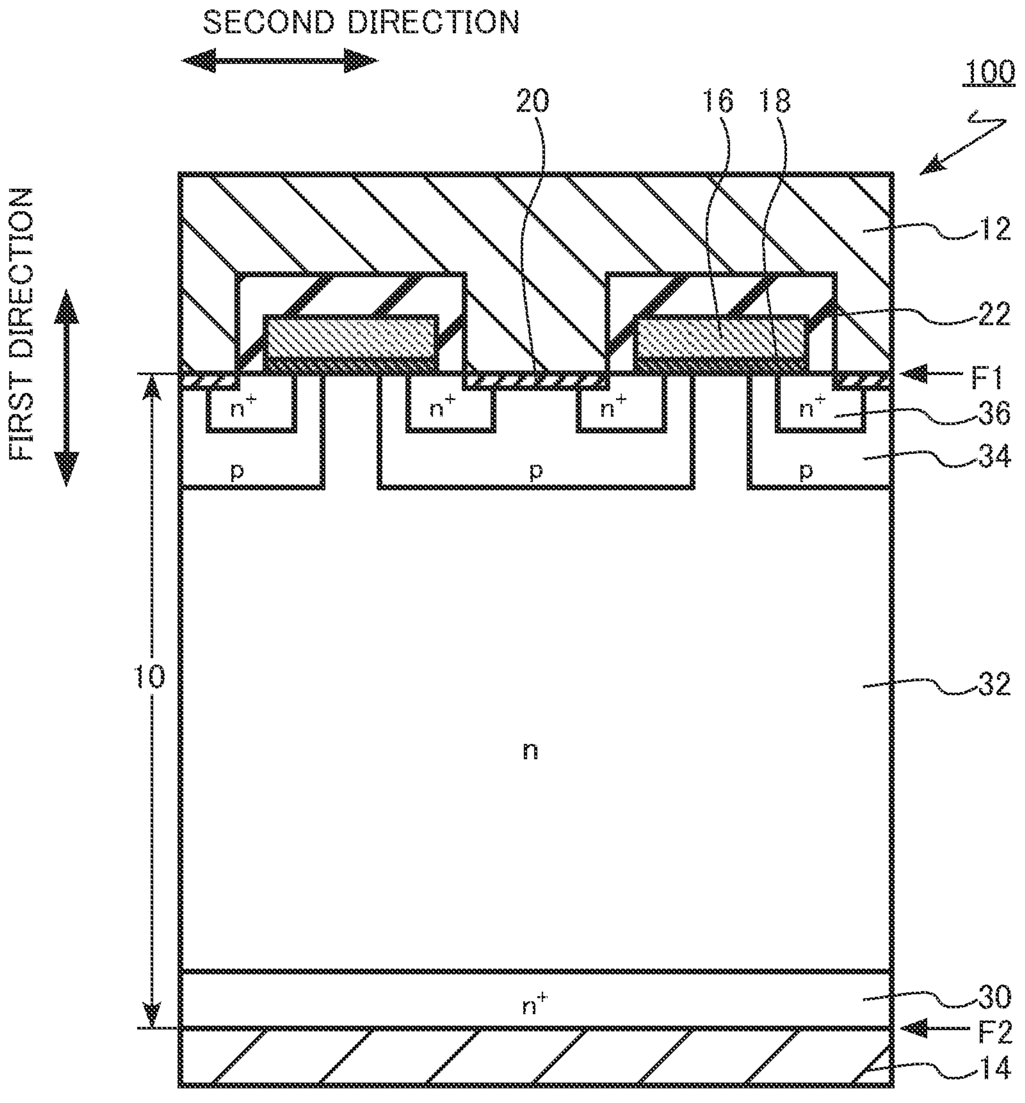
FIG. 1 is a schematic cross-sectional view of a semiconductor device according to a first embodiment.

A semiconductor device of embodiments includes: a first electrode; a second electrode; a semiconductor layer provided between the first electrode and the second electrode, having a first face facing the first electrode and a second face facing the second electrode, and containing silicon (Si); a first semiconductor region of n-type provided in the semiconductor layer; a second semiconductor region of p-type provided in the semiconductor layer and disposed between the first semiconductor region and the first face; a third semiconductor region of n-type provided in the semiconductor layer and disposed between the second semiconductor region and the first face; a gate electrode provided on the first face side of the semiconductor layer and facing the second semiconductor region; a gate insulating layer provided between the second semiconductor region and the gate electrode; and a metal silicide layer provided between the first electrode and the second semiconductor region and between the first electrode and the third semiconductor region, including a top surface in contact with the first electrode, a first bottom surface in contact with the third semiconductor region, and a first side surface in contact with the third semiconductor region, and containing at least one metal element selected from a group consisting of gold (Au), ruthenium (Ru), rhodium (Rh), palladium (Pd), osmium (Os), iridium (Ir), and platinum (Pt). In a first direction from the first electrode toward the second electrode, an n-type impurity concentration in the third semiconductor region monotonically decreases from the first bottom surface toward the second electrode.

Hereinafter, embodiments will be described with reference to the diagrams. In the following description, the same or similar members and the like will be denoted by the same reference numerals, and the description of the members and the like once described will be omitted as appropriate.

In addition, in the following description, when the notations of $n^+$, n, $n^-$, $p^+$, p, and $p^-$ are used, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

The impurity concentration in a semiconductor device can be measured by, for example, secondary ion mass spectrometry (SIMS). In addition, the relative high and low of the impurity concentration in the semiconductor device can be determined from, for example, the high and low of the carrier concentration obtained by scanning capacitance microscopy (SCM). In addition, the distance such as the width or depth of an impurity region in the semiconductor device can be calculated by, for example, SIMS. In addition, the distance such as the width or depth of an impurity region in the semiconductor device can be calculated from, for example, an SCM image.

The depth of a conductive layer, the thickness of an insulating layer, and the like in the semiconductor device can be measured, for example, on an image of SIMS or transmission electron microscope (TEM).

Material identification can be performed, for example, by energy dispersive X-ray spectroscopy (EDX). In addition, shape identification can be performed, for example, on a TEM image.

First Embodiment

A semiconductor device according to a first embodiment includes: a first electrode; a second electrode; a semiconductor layer provided between the first electrode and the second electrode, having a first face facing the first electrode and a second face facing the second electrode, and containing silicon (Si); a first semiconductor region of n-type provided in the semiconductor layer; a second semiconductor region of p-type provided in the semiconductor layer and disposed between the first semiconductor region and the first face; a third semiconductor region of n-type provided in the semiconductor layer and disposed between the second semiconductor region and the first face; a gate electrode provided on the first face side of the semiconductor layer and facing the second semiconductor region; a gate insulating layer provided between the second semiconductor region and the gate electrode; and a metal silicide layer provided between the first electrode and the second semiconductor region and between the first electrode and the third semiconductor region, including a top surface in contact with the first electrode, a first bottom surface in contact with the third semiconductor region, and a first side surface in contact with the third semiconductor region, and containing at least one metal element selected from a group consisting of gold (Au), ruthenium (Ru), rhodium (Rh), palladium (Pd), osmium (Os), iridium (Ir), and platinum (Pt). Assuming that a direction from the first electrode toward the second electrode is a first direction, an n-type impurity concentration in the first direction in the third semiconductor region monotonically decreases from a position of the third semiconductor region in contact with the first bottom surface toward the second electrode.

The semiconductor device according to the first embodiment is a vertical transistor. The semiconductor device according to the first embodiment is a vertical power MOSFET. The semiconductor device according to the first embodiment is a MOSFET 100. The MOSFET 100 is an re-channel MOSFET having electrons as carriers.

Figure 2:
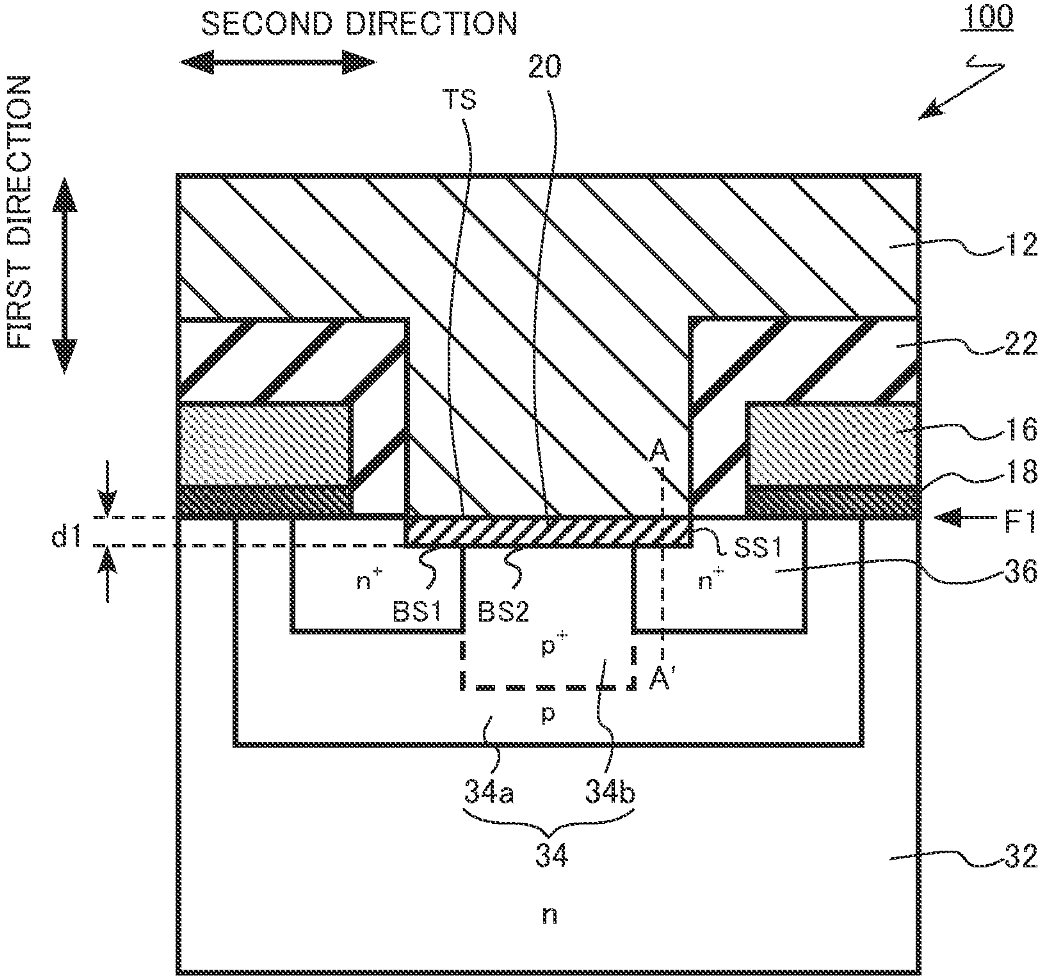
FIG. 2 is an enlarged schematic cross-sectional view of a part of the semiconductor device according to the first embodiment.

FIG. 1 is a schematic cross-sectional view of the semiconductor device according to the first embodiment. FIG. 2 is an enlarged schematic cross-sectional view of a part of the semiconductor device according to the first embodiment. FIG. 2 is a diagram showing the contact structure of the MOSFET 100.

The MOSFET 100 according to the first embodiment includes a semiconductor layer 10, a source electrode 12, a drain electrode 14, a gate electrode 16, a gate insulating layer 18, a metal silicide layer 20, and an interlayer insulating layer 22.

The source electrode 12 is an example of the first electrode. The drain electrode 14 is an example of the second electrode.

The semiconductor layer 10 includes an $n^+$-type drain region 30, an n-type drift region 32, a p-type body region 34, and an $n^+$-type source region 36. The body region 34 includes a p-type low concentration region 34*a* and a $p^+$-type high concentration region 34*b*.

The drift region 32 is an example of the first semiconductor region. The body region 34 is an example of the second semiconductor region. The source region 36 is an example of the third semiconductor region.

The semiconductor layer 10 is provided between the source electrode 12 and the drain electrode 14.

The semiconductor layer 10 includes a first face ("F1" in FIG. 1) and a second face ("F2" in FIG. 1). The second face F2 faces the first face F1. The first face F1 and the second face F2 are parallel to each other. The first face F1 is the surface of the semiconductor layer 10, and the second face F2 is the back surface of the semiconductor layer 10.

The first face F1 faces the source electrode 12. The second face F2 faces the drain electrode 14.

A direction from the source electrode 12 to the drain electrode 14 is defined as a first direction. The first direction is a direction perpendicular to the first face F1 and the second face F2.

A direction perpendicular to the first direction is defined as a second direction. The second direction is a direction parallel to the first face F1 and the second face F2.

Hereinafter, "depth" means a depth with respect to the first face F1. That is, "depth" means a distance in the first direction with respect to the first face F1.

The semiconductor layer 10 contains silicon (Si). The semiconductor layer 10 is, for example, silicon (Si). The semiconductor layer 10 is, for example, single crystal silicon (Si).

The surface of the semiconductor layer 10 is, for example, a surface inclined at an angle equal to or more than 0° and equal to or less than 8° with respect to the (100) face of silicon. The first face F1 is, for example, a surface inclined at an angle equal to or more than 0° and equal to or less than 8° with respect to the (100) face of silicon.

The $n^+$-type drain region 30 is provided in the semiconductor layer 10. The drain region 30 contains $n^-$ type impurities. The n-type impurity is, for example, phosphorus (P) or arsenic (As). The n-type impurity concentration in the drain region 30 is, for example, equal to or more than $1\times10^{18}$ atoms/cm$^3$ and equal to or less than $1\times10^{21}$ atoms/cm$^3$.

The n-type drift region 32 is provided in the semiconductor layer 10. The drift region 32 is disposed between the drain region 30 and the first face F1. The drift region 32 is provided on the drain region 30.

The drift region 32 contains n-type impurities. The n-type impurity is, for example, phosphorus (P) or arsenic (As). The n-type impurity concentration in the drift region 32 is, for example, equal to or more than $1\times10^{14}$ atoms/cm$^3$ and equal to or less than $1\times10^{18}$ atoms/cm$^3$.

The drift region 32 contains at least one metal element selected from a group consisting of gold (Au), ruthenium (Ru), rhodium (Rh), palladium (Pd), osmium (Os), iridium (Ir), and platinum (Pt).

The p-type body region 34 is provided in the semiconductor layer 10. The body region 34 is provided between the drift region 32 and the first face F1. When the MOSFET 100 is turned on, a channel is formed in a region where the gate insulating layer 18 and the body region 34 are in contact with each other.

As shown in FIG. 2, the body region 34 includes the p-type low concentration region 34*a* and the $p^+$-type high concentration region 34*b*. The high concentration region 34*b* is provided between the low concentration region 34*a* and the source electrode 12. The high concentration region 34*b* is provided between the low concentration region 34*a* and the metal silicide layer 20.

The body region 34 is in contact with the metal silicide layer 20. The high concentration region 34*b* is in contact with the metal silicide layer 20.

The body region 34 contains p-type impurities. The p-type impurity is, for example, boron (B). The p-type impurity concentration in the body region 34 is, for example, equal to or more than $1\times10^{16}$ atoms/cm$^3$ and equal to or less than $1\times10^{21}$ atoms/cm$^3$.

The p-type impurity concentration in the low concentration region 34*a* is, for example, equal to or more than $1\times10^{16}$ atoms/cm$^3$ and less than $1\times10^{18}$ atoms/cm$^3$. The p-type impurity concentration in the high concentration region 34*b* is, for example, equal to or more than $1\times10^{18}$ atoms/cm$^3$ and equal to or less than $1\times10^{21}$ atoms/cm$^3$.

The $n^+$-type source region 36 is provided in the semiconductor layer 10. The source region 36 is disposed between the body region 34 and the first face F1.

The source region 36 is disposed between the body region 34 and the metal silicide layer 20. The source region 36 is in contact with the metal silicide layer 20.

The source region 36 contains n-type impurities. The n-type impurity is, for example, phosphorus (P) or arsenic (As). The n-type impurity concentration in the source region 36 is, for example, equal to or more than $1\times10^{19}$ atoms/cm$^3$ and equal to or less than $1\times10^{21}$ atoms/cm$^3$.

The gate electrode 16 is provided on the semiconductor layer 10. The gate electrode 16 is provided on the first face F1 side of the semiconductor layer 10. The gate electrode 16 is provided on the first face F1.

The gate electrode 16 extends, for example, in a third direction perpendicular to the first direction and perpendicular to the second direction. For example, the gate electrode 16 is arranged repeatedly in the second direction.

The gate electrode 16 faces the body region 34. The gate electrode 16 faces the drift region 32. The gate electrode 16 faces the source region 36.

The gate electrode 16 is a conductor. The gate electrode 16 is, for example, polycrystalline silicon containing n-type impurities or p-type impurities.

The gate insulating layer 18 is provided between the gate electrode 16 and the semiconductor layer 10. The gate insulating layer 18 is provided between the gate electrode 16 and the body region 34. The gate insulating layer 18 is provided between the gate electrode 16 and the drift region 32. The gate insulating layer 18 is provided between the gate electrode 16 and the source region 36.

The gate insulating layer 18 is an insulator. The gate insulating layer 18 is, for example, a silicon oxide.

The interlayer insulating layer 22 is provided between the gate electrode 16 and the source electrode 12.

The interlayer insulating layer 22 has a function of electrically separating the gate electrode 16 and the source electrode 12 from each other.

The interlayer insulating layer 22 is an insulator. The interlayer insulating layer 22 is, for example, a silicon oxide.

The source electrode 12 is provided on the first face F1 side of the semiconductor layer 10. The source electrode 12 is provided on the first face F1 of the semiconductor layer 10.

The source electrode 12 is electrically connected to the source region 36. The source electrode 12 is electrically connected to the body region 34.

The source electrode 12 is a metal. The source electrode 12 has, for example, a stacked structure of titanium nitride (TiN) and aluminum (Al).

The drain electrode 14 is provided on the second face F2 side of the semiconductor layer 10. The drain electrode 14 is provided on the second face F2 of the semiconductor layer 10. The drain electrode 14 is electrically connected to the drain region 30. The drain electrode 14 is in contact with the drain region 30.

The drain electrode 14 is a metal. The drain electrode 14 has a stacked structure of materials selected from titanium (Ti), aluminum (Al), nickel (Ni), copper (Cu), silver (Ag), and gold (Au), for example.

The metal silicide layer 20 is provided between the source electrode 12 and the semiconductor layer 10.

The metal silicide layer 20 is provided between the source electrode 12 and the source region 36. The metal silicide layer 20 is in contact with the source electrode 12. The metal silicide layer 20 is in contact with the source region 36.

The metal silicide layer 20 is provided between the source electrode 12 and the body region 34. The metal silicide layer 20 is in contact with the body region 34. The metal silicide layer 20 is in contact with the high concentration region 34*b*.

The metal silicide layer 20 includes a top surface TS, a first bottom surface BS1, a second bottom surface BS2, and a first side surface SS1. The top surface TS of the metal silicide layer 20 is in contact with the source electrode 12. The first bottom surface BS1, the second bottom surface BS2, and the first side surface SS1 of the metal silicide layer 20 are in contact with the semiconductor layer 10.

The first bottom surface BS1 of the metal silicide layer 20 is in contact with the source region 36. The second bottom surface BS2 of the metal silicide layer 20 is in contact with the high concentration region 34*b*. The first side surface SS1 of the metal silicide layer 20 is in contact with the source region 36.

The position of the first bottom surface BS1 in the first direction is closer to the second face F2 than the position of the first face F1 in the first direction. The position of first bottom surface BS1 in the first direction is closer to the second face F2 than the position of an interface between the gate insulating layer 18 and the source region 36 in the first direction. The position of first bottom surface BS1 in the first direction is closer to the second face F2 than the position of an interface between the interlayer insulating layer 22 and the source region 36 in the first direction.

The distance from the second face F2 to the first bottom surface BS1 is smaller than the distance from the second face F2 to the first face F1. The distance from the second face F2 to the metal silicide layer 20 is smaller than the distance from the second face F2 to the gate insulating layer 18.

A distance (d1 in FIG. 2) between the first face F1 and the first bottom surface BS1 in the first direction is, for example, equal to or more than 10 nm and equal to or less than 100 nm.

The position of the first bottom surface BS1 in the first direction and the position of the second bottom surface BS2 in the first direction are, for example, the same. The first bottom surface BS1 and the second bottom surface BS2 are, for example, on the same plane.

The first side surface SS1 may have a tapered shape.

The metal silicide layer 20 contains at least one metal element selected from a group consisting of gold (Au), ruthenium (Ru), rhodium (Rh), palladium (Pd), osmium (Os), iridium (Ir), and platinum (Pt). The metal silicide layer 20 contains silicide of gold or a platinum group element.

The metal silicide layer 20 contains platinum silicide, for example. The metal silicide layer 20 is, for example, a platinum silicide layer.

Figure 3:
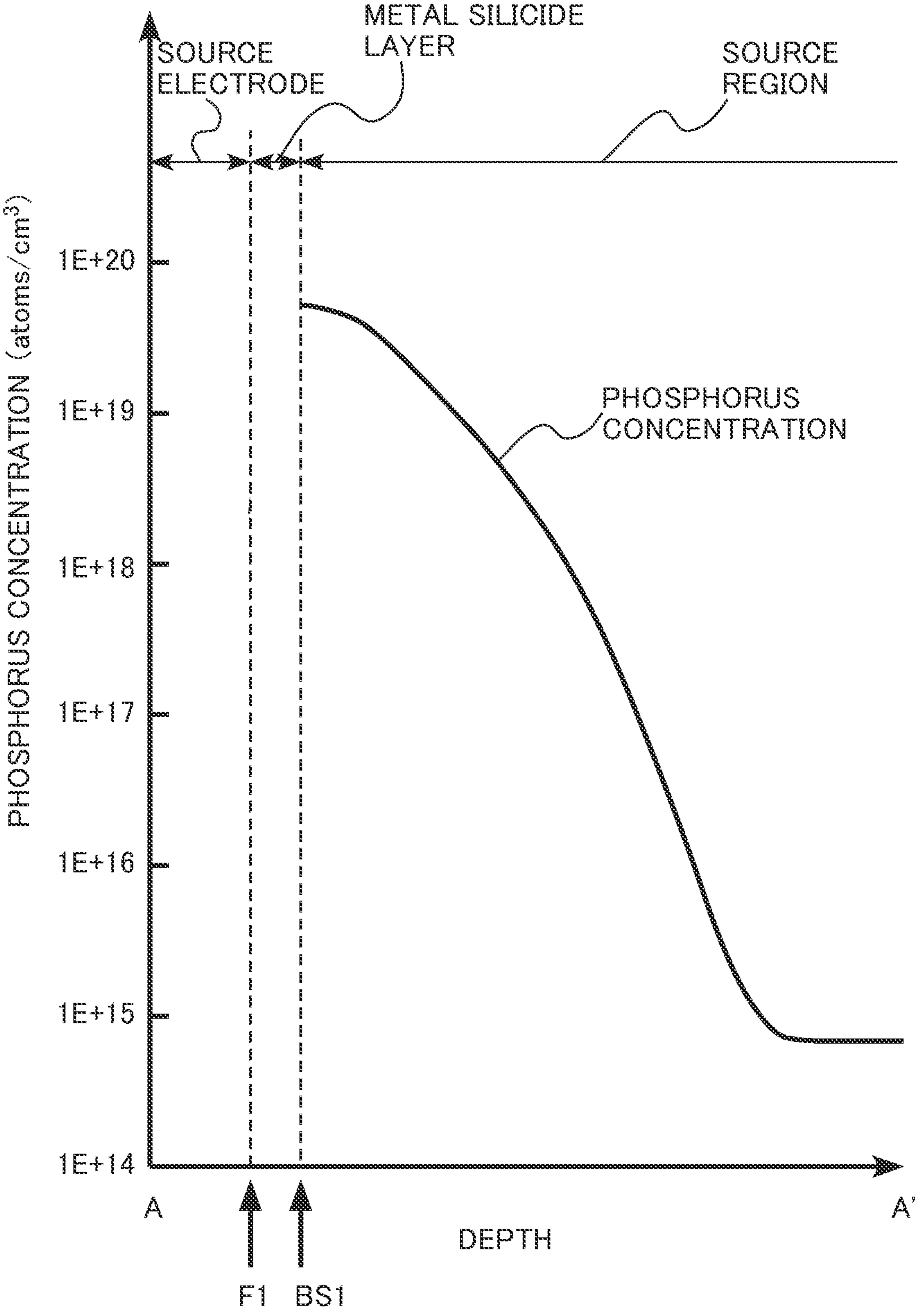
FIG. 3 is a diagram showing the distribution of an n-type impurity concentration in the semiconductor device according to the first embodiment.

FIG. 3 is a diagram showing the distribution of the n-type impurity concentration in the semiconductor device according to the first embodiment. FIG. 3 shows the distribution of the n-type impurity concentration in the depth direction of the source region 36 of the MOSFET 100. FIG. 3 shows the distribution of the n-type impurity concentration in the first direction of the source region 36 of the MOSFET 100.

FIG. 3 shows the distribution of the n-type impurity concentration in a portion along the dotted line AA' in FIG. 2. FIG. 3 shows an example in which the n-type impurity contained in the source region 36 is phosphorus (P).

The horizontal axis in FIG. 3 indicates the position of the first face F1 and the position of the first bottom surface BS1.

As shown in FIG. 3, the phosphorus concentration in the depth direction of the source region 36 monotonically decreases from the position where the source region 36 is in contact with the first bottom surface BS1 of the metal silicide layer 20 toward the drain electrode 14. The phosphorus concentration in the depth direction of the source region 36 is maximized at the position where the source region 36 is in contact with the first bottom surface BS1.

The n-type impurity concentration in the source region 36 in contact with the first bottom surface BS1 is, for example, equal to or more than $2\times10^{19}$ atoms/$cm^3$.

The thickness of the metal silicide layer 20 in the first direction is, for example, equal to or more than 10 nm and equal to or less than 50 nm.

The metal silicide layer 20 serves as a metal element diffusion source during the manufacturing of the MOSFET 100. The metal element diffused from the metal silicide layer 20 to the drift region 32 functions as a lifetime killer.

Figure 4:
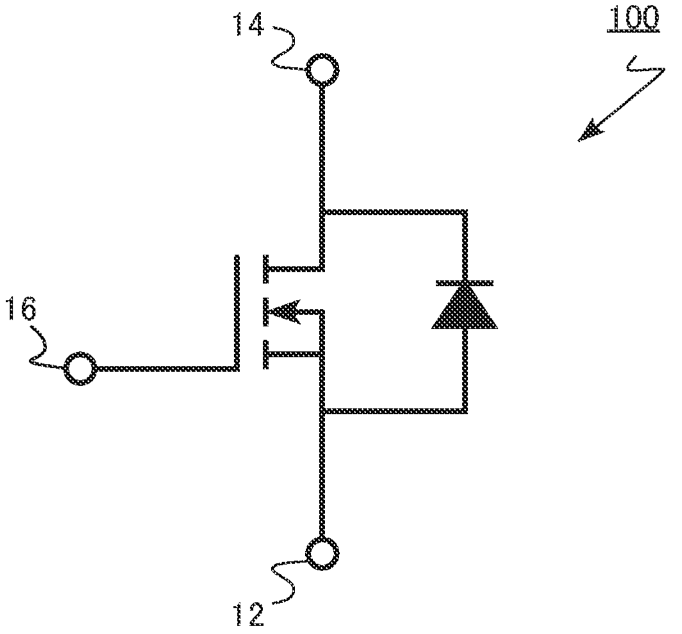
FIG. 4 is an equivalent circuit diagram of the semiconductor device according to the first embodiment.

FIG. 4 is an equivalent circuit diagram of the semiconductor device according to the first embodiment. Between the source electrode 12 and the drain electrode 14, a pn diode is connected as a body diode in parallel with a transistor. The source electrode 12 functions as an anode electrode of the pn junction diode, and the drain electrode 14 functions as a cathode electrode of the pn junction diode.

For example, a case where the MOSFET 100 is used as a switching element connected to an inductive load is considered. When the MOSFET 100 is turned off, a voltage that makes the source electrode 12 positive with respect to the drain electrode 14 may be applied by the load current due to the inductive load. In this case, a forward current flows through the pn junction diode. In other words, the pn junction diode is turned on.

A reverse recovery current flows through the pn junction diode during the operation of turning the pn junction diode from the on state to the off state, that is, during the reverse recovery operation. When the carrier lifetime of the drift region 32 is long, the carriers injected into the drift region 32 are discharged to the source electrode 12 and the drain electrode 14. As a result, a large reverse recovery current flows during the reverse recovery operation, and the switching loss increases.

In the MOSFET 100, a metal element serving as a lifetime killer is introduced from the metal silicide layer into the drift region 32 by using thermal diffusion. Therefore, the carrier lifetime of the drift region 32 is shortened, and the carriers injected into the drift region 32 are recombined in the drift region 32 or trapped in a level, and are not discharged to the source electrode 12 and the drain electrode 14. As a result, the reverse recovery current decreases. Therefore, it is possible to reduce the switching loss during the reverse recovery operation.

Next, an example of a semiconductor device manufacturing method according to the first embodiment will be described.

A semiconductor device manufacturing method according to the first embodiment includes: forming an impurity region by ion-implanting n-type impurities or p-type impurities into a semiconductor layer containing silicon (Si); depositing, on the impurity region, a first metal film containing at least one metal element selected from a group consisting of gold (Au), ruthenium (Ru), rhodium (Rh), palladium (Pd), osmium (Os), iridium (Ir), and platinum (Pt): forming a metal silicide layer by performing a first heat treatment at a temperature equal to or more than 100° C. and equal to or less than 550° C. so that the first metal film and the impurity region react with each other; removing the first metal film unreacted by using a solution containing aqua regia; etching the impurity region below the metal silicide layer by using a solution containing hydrofluoric acid; and depositing a second metal film on the metal silicide layer.

FIGS. 5 to 13 are schematic cross-sectional views showing the semiconductor device according to the first embodiment during manufacturing. FIGS. 5 to 13 show cross sections corresponding to FIG. 2 of the first embodiment.

Hereinafter, a case where a first metal film is a platinum film and a second metal film is a stacked film of a titanium nitride film and an aluminum film will be described as an example. In addition, a case where the deposition of the first metal film and the first heat treatment are performed in the same process will be described as an example.

Figure 5:
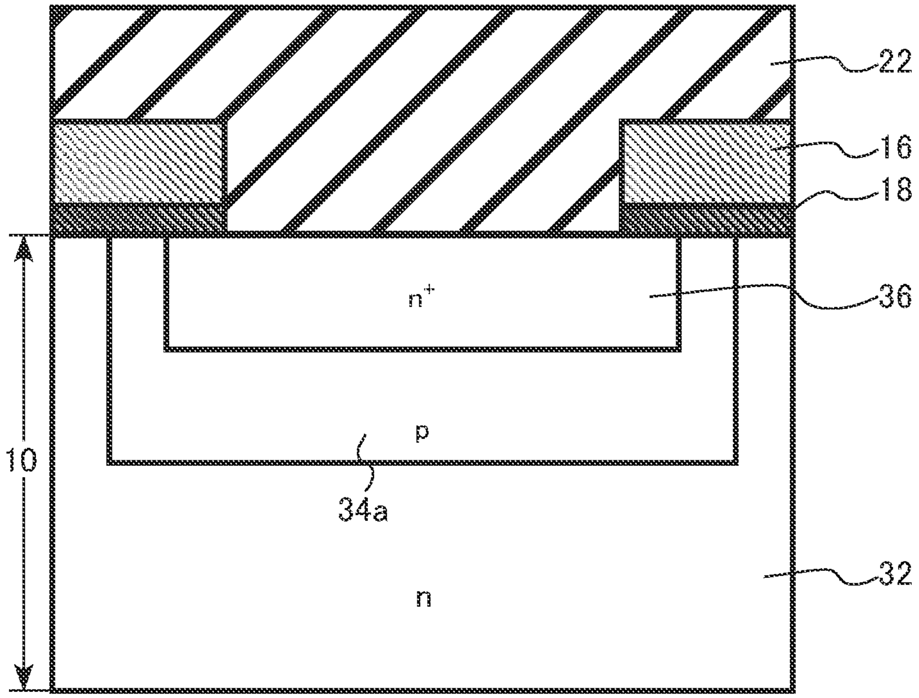
FIG. 5 is a schematic cross-sectional view of the semiconductor device according to the first embodiment during manufacturing.

First, the p-type low concentration region 34*a*, the $n^+$-type source region 36, the gate insulating layer 18, the gate electrode 16, and the interlayer insulating layer 22 are formed in the semiconductor layer 10 including the $n^+$-type drain region 30 and the n-type drift region 32 by using a known process technique (FIG. 5). The semiconductor layer 10 is, for example, single crystal silicon.

The p-type low concentration region 34*a* is formed, for example, by ion-implanting boron (B), which is a p-type impurity, into the semiconductor layer 10. The $n^+$-type source region 36 is formed, for example, by ion-implanting phosphorus (P), which is an n-type impurity, into the semiconductor layer 10. The source region 36 is an example of the impurity region.

Figure 6:
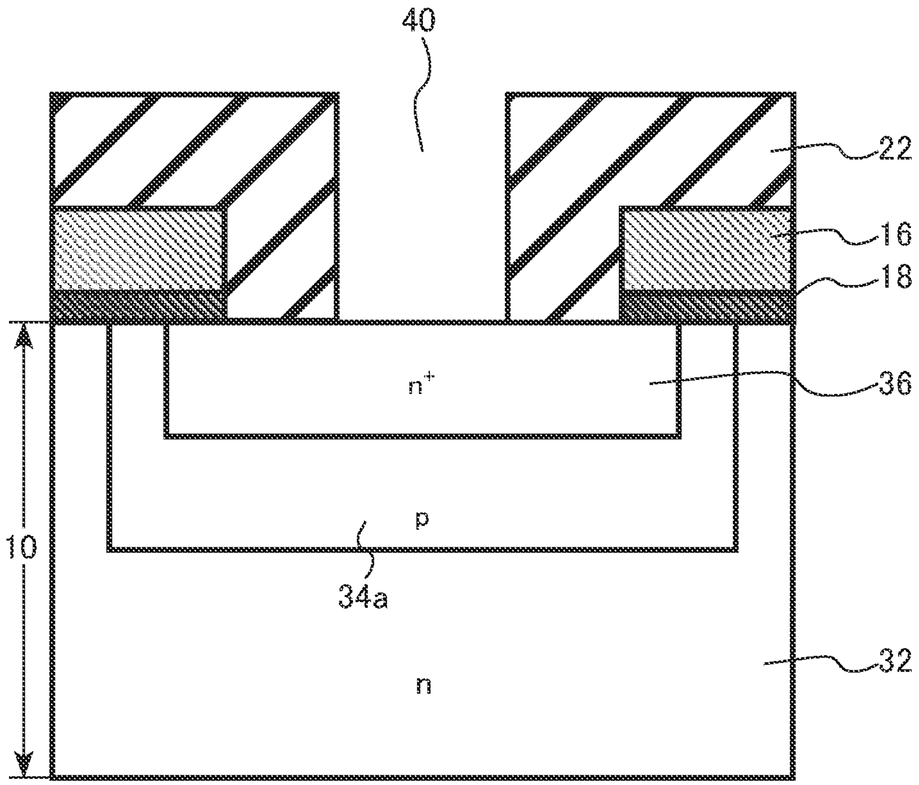
FIG. 6 is a schematic cross-sectional view of the semiconductor device according to the first embodiment during manufacturing.

Then, an opening 40 is formed in the interlayer insulating layer 22 on the source region 36 (FIG. 6). The opening 40 is formed by using, for example, a photolithographic method and a reactive ion etching method (RIE method).

Figure 7:
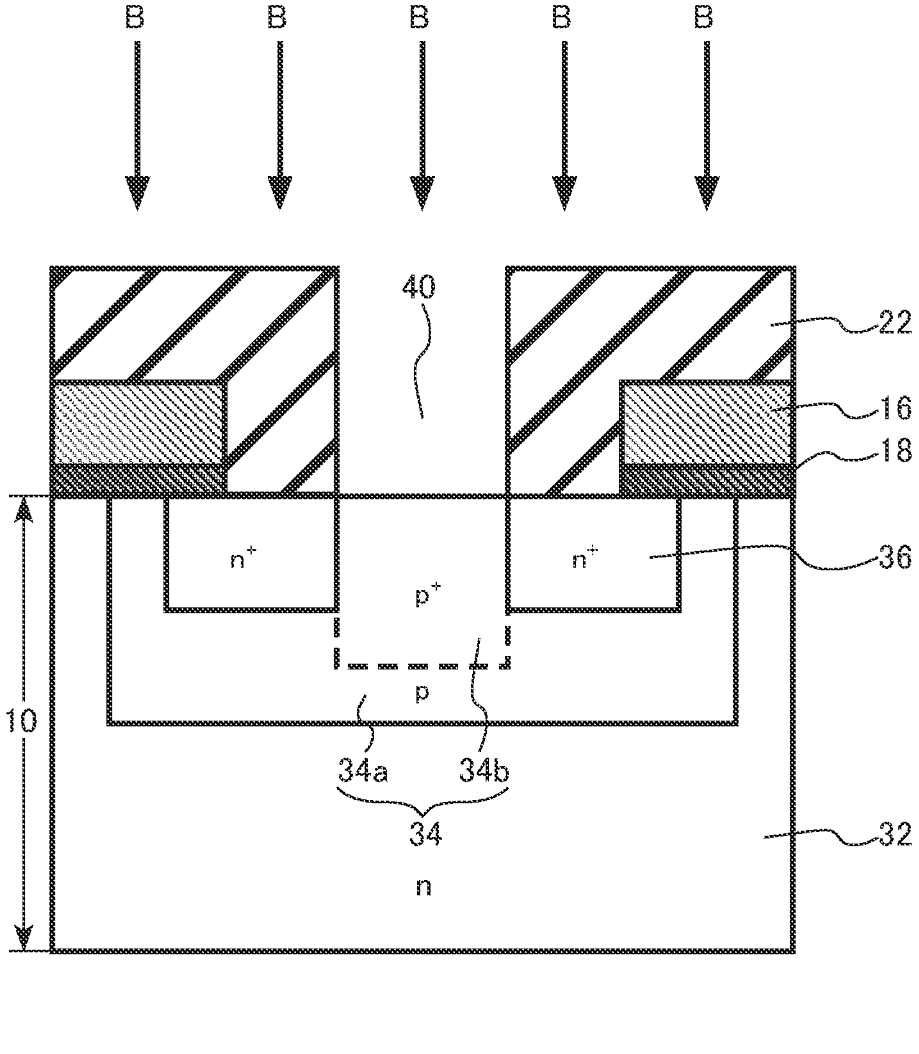
FIG. 7 is a schematic cross-sectional view of the semiconductor device according to the first embodiment during manufacturing.

Then, by using the interlayer insulating layer 22 as a mask material, boron (B), which is a p-type impurity, is ion-implanted into the semiconductor layer 10 through the opening 40 (FIG. 7). By ion-implanting boron (B) into the semiconductor layer 10, the $p^+$-type high concentration region 34*b* is formed. The high concentration region 34*b* is an example of the impurity region.

Figure 8:
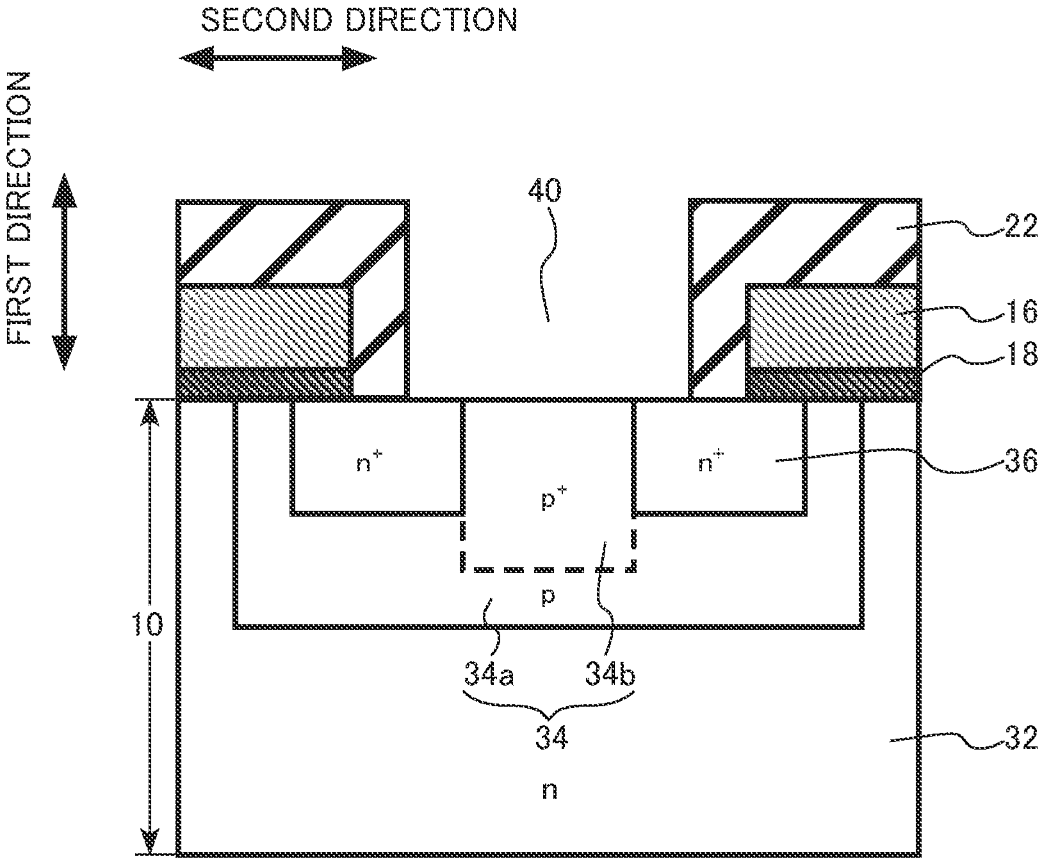
FIG. 8 is a schematic cross-sectional view of the semiconductor device according to the first embodiment during manufacturing.

Then, a part of the interlayer insulating layer 22 is removed by etching (FIG. 8). For the etching of the interlayer insulating layer 22, for example, a wet etching method is used. As an etchant for etching the interlayer insulating layer 22, for example, a solution containing hydrofluoric acid is used.

By etching a part of the interlayer insulating layer 22, the width of the opening 40 in the second direction is increased. By etching a part of the interlayer insulating layer 22, the source region 36 is exposed at the bottom of the opening 40.

Figure 9:
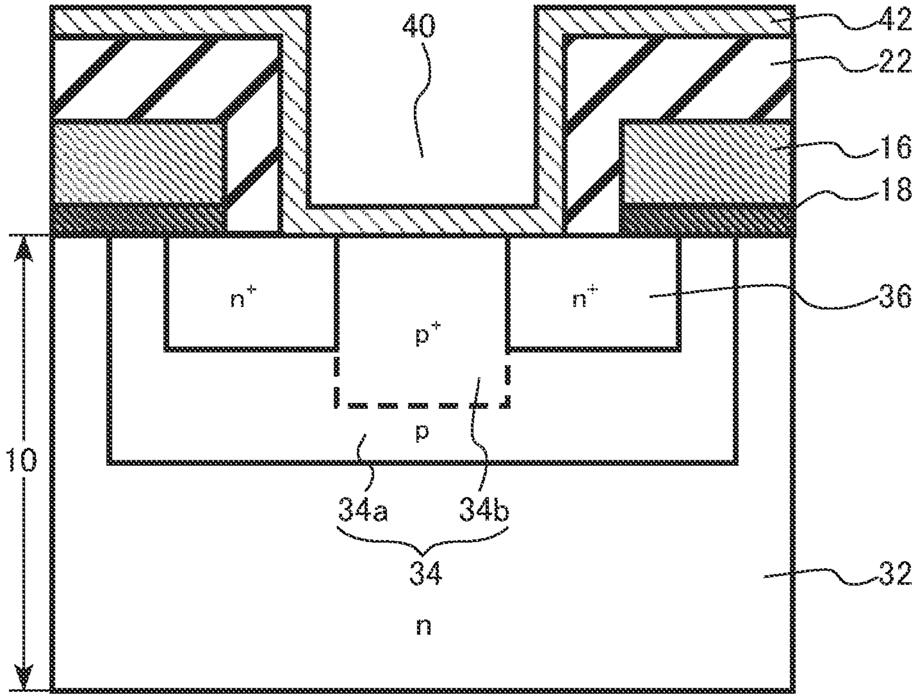
FIG. 9 is a schematic cross-sectional view of the semiconductor device according to the first embodiment during manufacturing.

Then, a platinum film 42 is deposited on the semiconductor layer 10 (FIG. 9). The platinum film 42 is an example of the first metal film. The platinum film 42 is formed by using a sputtering method, for example.

The platinum film 42 is deposited at a temperature equal to or more than 100° C. and equal to or less than 550° C., for example. For example, when the platinum film 42 is deposited by using a sputtering method, the platinum film 42 is deposited while the temperature of the semiconductor layer 10 is equal to or more than 100° C. and equal to or less than 550° C.

Figure 10:
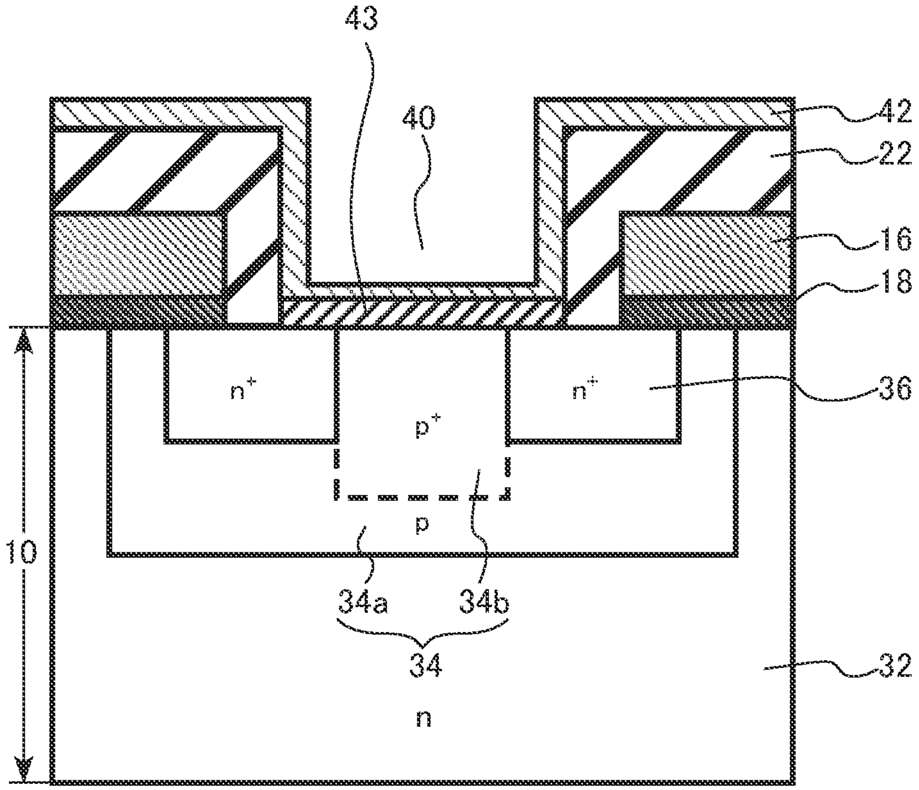
FIG. 10 is a schematic cross-sectional view of the semiconductor device according to the first embodiment during manufacturing.

The deposition of the platinum film 42 is an example of the first heat treatment. By the first heat treatment, the platinum film 42 and the semiconductor layer react with each other to form a platinum silicide layer 43 (FIG. 10). The platinum film 42 reacts with the source region 36 and the high concentration region 34*b* to form the platinum silicide layer 43. The platinum silicide layer 43 is an example of a metal silicide layer.

The deposition of the platinum film 42 and the first heat treatment may be performed as different treatments. When the deposition of the platinum film 42 and the first heat treatment are performed as different treatments, for example, the temperature for depositing the platinum film 42 is lower than the temperature for the first heat treatment.

Figure 11:
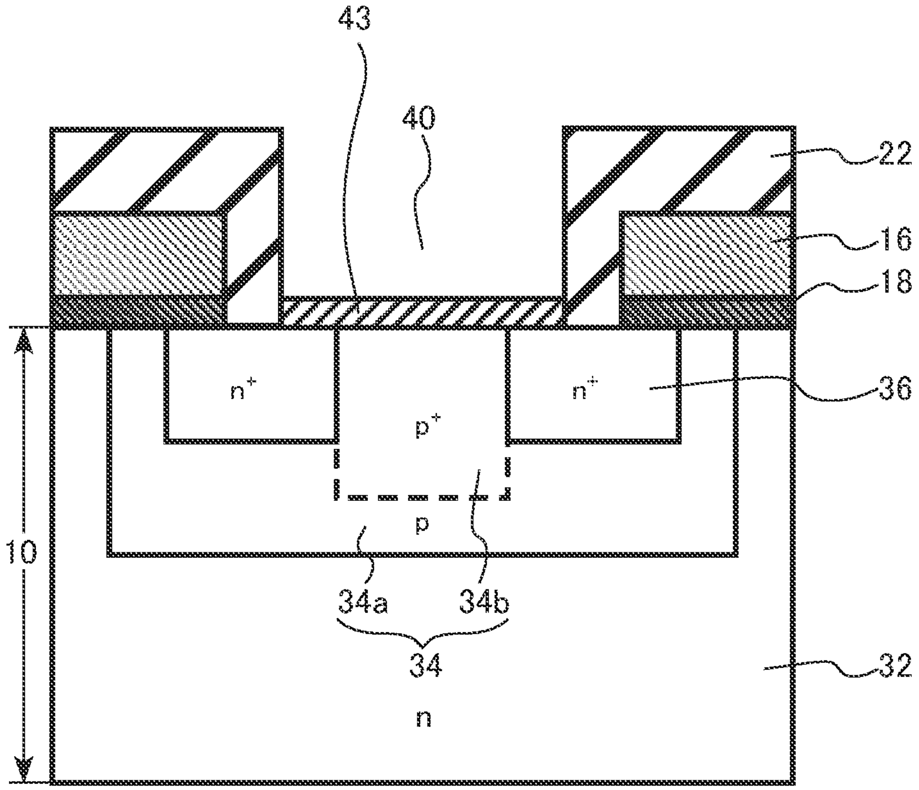
FIG. 11 is a schematic cross-sectional view of the semiconductor device according to the first embodiment during manufacturing.

Then, the unreacted platinum film 42 is removed (FIG. 11). The unreacted platinum film 42 is removed by using a solution containing aqua regia as an etching etchant.

Figure 12:
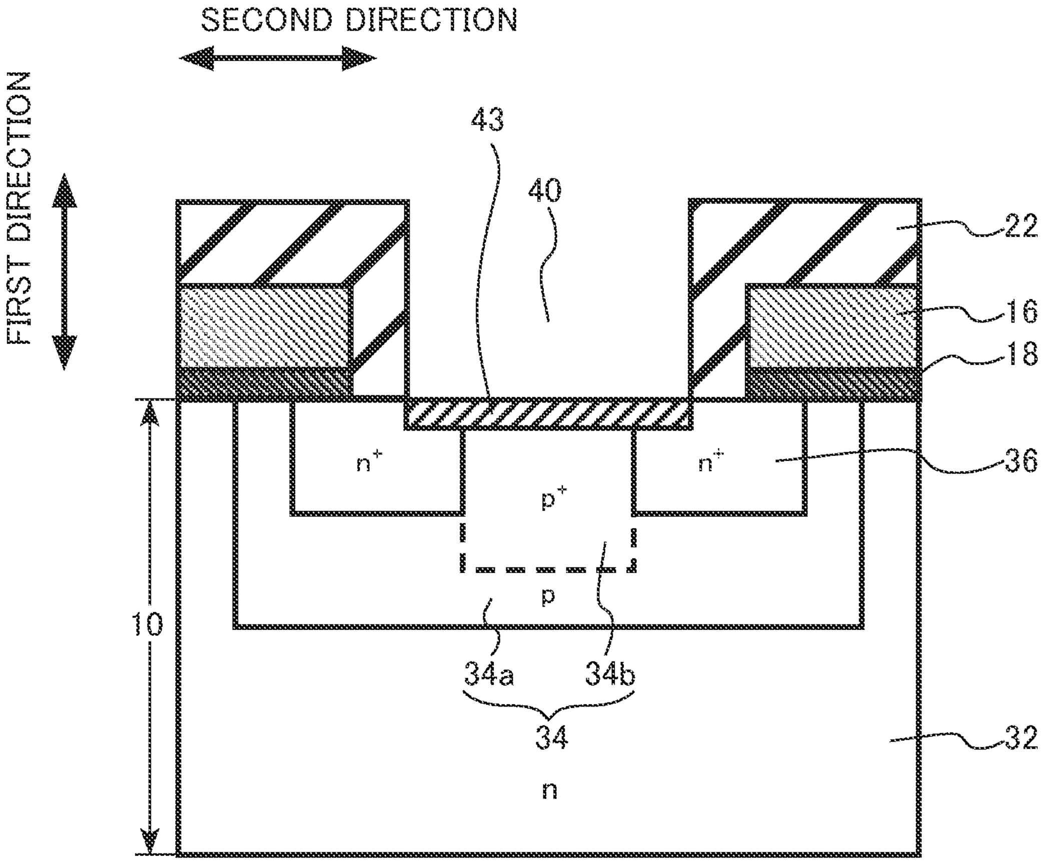
FIG. 12 is a schematic cross-sectional view of the semiconductor device according to the first embodiment during manufacturing.

Then, the semiconductor layer 10 below the platinum silicide layer 43 is etched (FIG. 12). As the etchant for etching the semiconductor layer 10, a solution containing hydrofluoric acid is used. The etchant is, for example, dilute hydrofluoric acid. The etchant may contain an oxidizing agent such as hydrogen peroxide, for example.

The etching of the semiconductor layer 10 is performed by using a so-called metal-assisted chemical etching method (MacEtch method). Since the platinum silicide layer 43 acts as a catalyst, the semiconductor layer 10 below the platinum silicide layer 43 is selectively etched. The source region 36 and the high concentration region 34*b* below the platinum silicide layer 43 are selectively etched. By etching the semiconductor layer 10, the bottom surface of the platinum silicide layer 43 moves toward the second face F2 as shown in FIG. 12.

When the semiconductor layer 10 below the platinum silicide layer 43 is etched, the bottom surface of the platinum silicide layer 43 is etched up to a depth exceeding the peak position of the depth-direction distribution of the n-type impurity concentration in the source region 36. The etching amount of the semiconductor layer 10 can be controlled, for example, by controlling the etching time.

Then, a second heat treatment is performed at a temperature higher than that of the first heat treatment. By the second heat treatment, platinum (Pt) contained in the platinum silicide layer 43 is diffused into the semiconductor layer 10. By the second heat treatment, platinum (Pt) is diffused into the drift region 32.

The temperature of the second heat treatment is, for example, equal to or more than 700° C. and equal to or less than 1000° C. The second heat treatment is performed, for example, in a non-oxidizing atmosphere. The second heat treatment is performed, for example, in a nitrogen atmosphere or an argon atmosphere.

Figure 13:
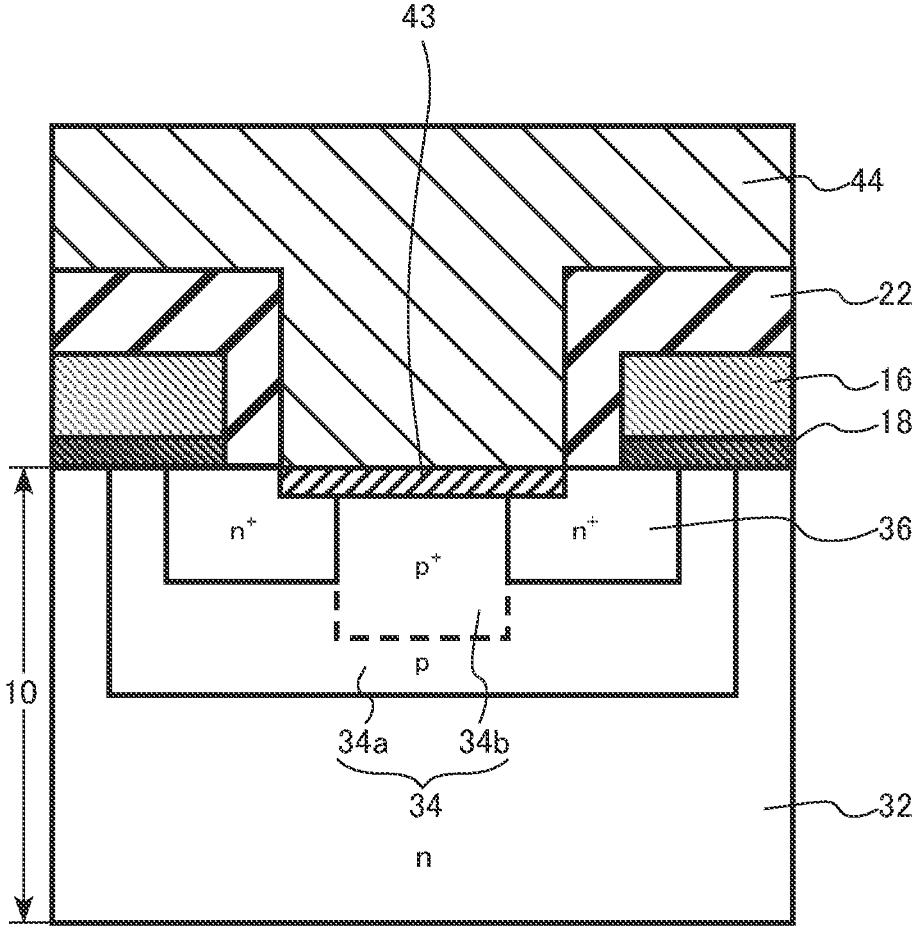
FIG. 13 is a schematic cross-sectional view of the semiconductor device according to the first embodiment during manufacturing.

Then, a stacked film 44 of a titanium nitride film and an aluminum film is deposited on the platinum silicide layer 43 (FIG. 13). The stacked film 44 is an example of the second metal film. The stacked film 44 finally becomes the source electrode 12.

Then, the drain electrode 14 is formed on the second face F2 side of the semiconductor layer 10 by using a known process technique.

By the manufacturing method described above, the MOSFET 100 according to the first embodiment shown in FIGS. 1 and 2 is manufactured.

Next, the function and effect of the semiconductor device and the semiconductor device manufacturing method according to the first embodiment will be described.

In the MOSFET 100 according to the first embodiment, the drift region 32 contains at least one metal element selected from a group consisting of gold (Au), ruthenium (Ru), rhodium (Rh), palladium (Pd), osmium (Os), iridium (Ir), and platinum (Pt). The drift region 32 of the MOSFET 100 according to the first embodiment contains gold or a platinum group element. The gold or platinum group element in the drift region 32 is a metal element diffused from the metal silicide layer 20 containing gold or a platinum group element during the manufacturing process of the MOSFET 100.

The gold or platinum group element contained in the drift region 32 functions as a lifetime killer. For this reason, the carrier lifetime of the drift region 32 is shortened. Therefore, the reverse recovery current of the pn junction diode included in the MOSFET 100 as a body diode is reduced. As a result, the switching loss of the MOSFET 100 is reduced.

In particular, a Schottky barrier between gold or platinum group element silicide and n-type semiconductor containing silicon (Si) tends to be high. Therefore, in a MOSFET including a metal silicide layer containing gold or a platinum group element, the contact resistance between the metal silicide layer and the $n^+$-type source region may increase. As the contact resistance between the metal silicide layer and the $n^+$-type source region increases, the on-resistance of the MOSFET increases, which causes a problem.

Figure 14:
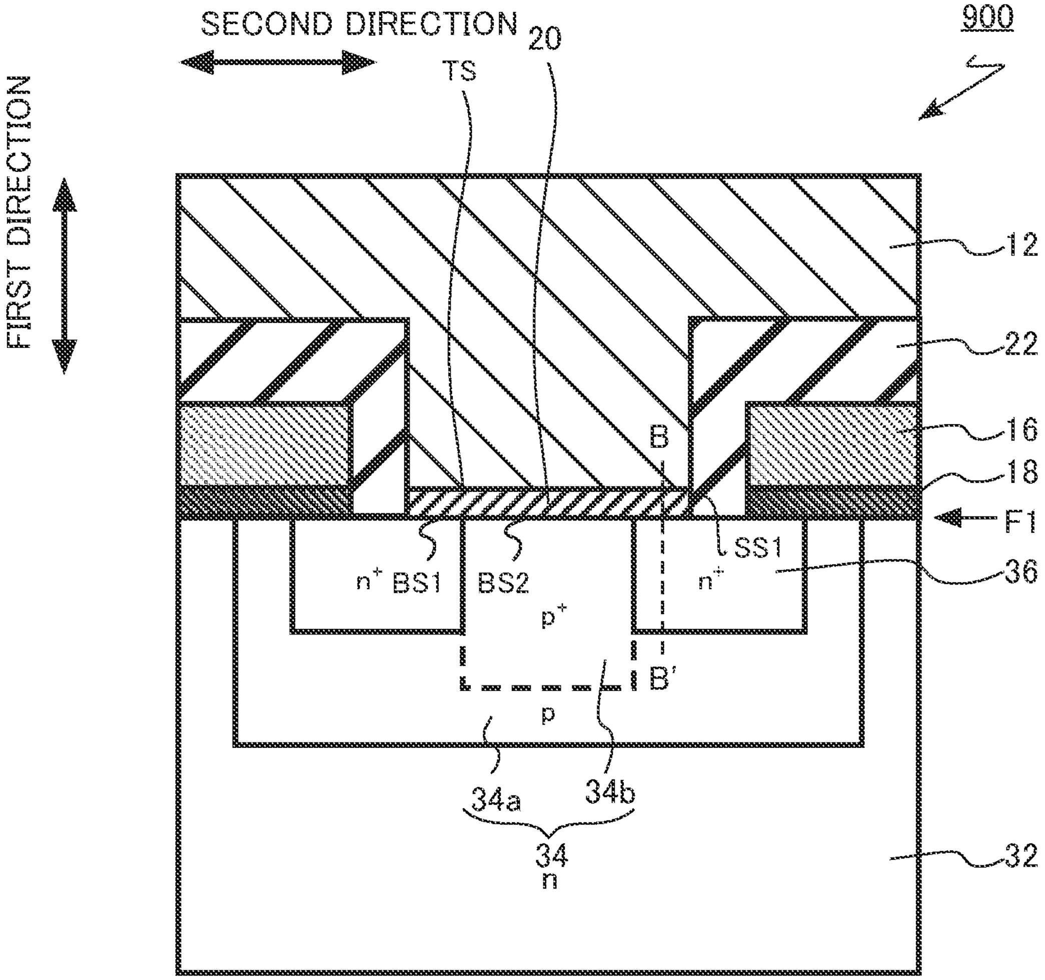
FIG. 14 is an enlarged schematic cross-sectional view of a part of a semiconductor device of a comparative example.

FIG. 14 is an enlarged schematic cross-sectional view of a part of a semiconductor device of a comparative example. FIG. 14 is a diagram corresponding to FIG. 2 of the first embodiment.

A MOSFET 900 of the comparative example is different from the MOSFET 100 according to the first embodiment in that the position of the first bottom surface BS1 in the first direction and the position of the first face F1 in the first direction are approximately the same. In other words, the MOSFET 900 of the comparative example is different from the MOSFET 100 according to the first embodiment in that the first bottom surface BS1 and the first face F1 are approximately on the same plane.

The MOSFET 900 of the comparative example can be manufactured, for example, by omitting the step of etching the semiconductor layer 10 below the metal silicide layer from the manufacturing steps of the MOSFET 100 according to the first embodiment. Since the semiconductor layer 10 below the metal silicide layer 20 is not etched after the metal silicide layer 20 is formed, the position of the first bottom surface BS1 in the first direction and the position of the first face F1 in the first direction can be made to be approximately the same.

Figure 15:
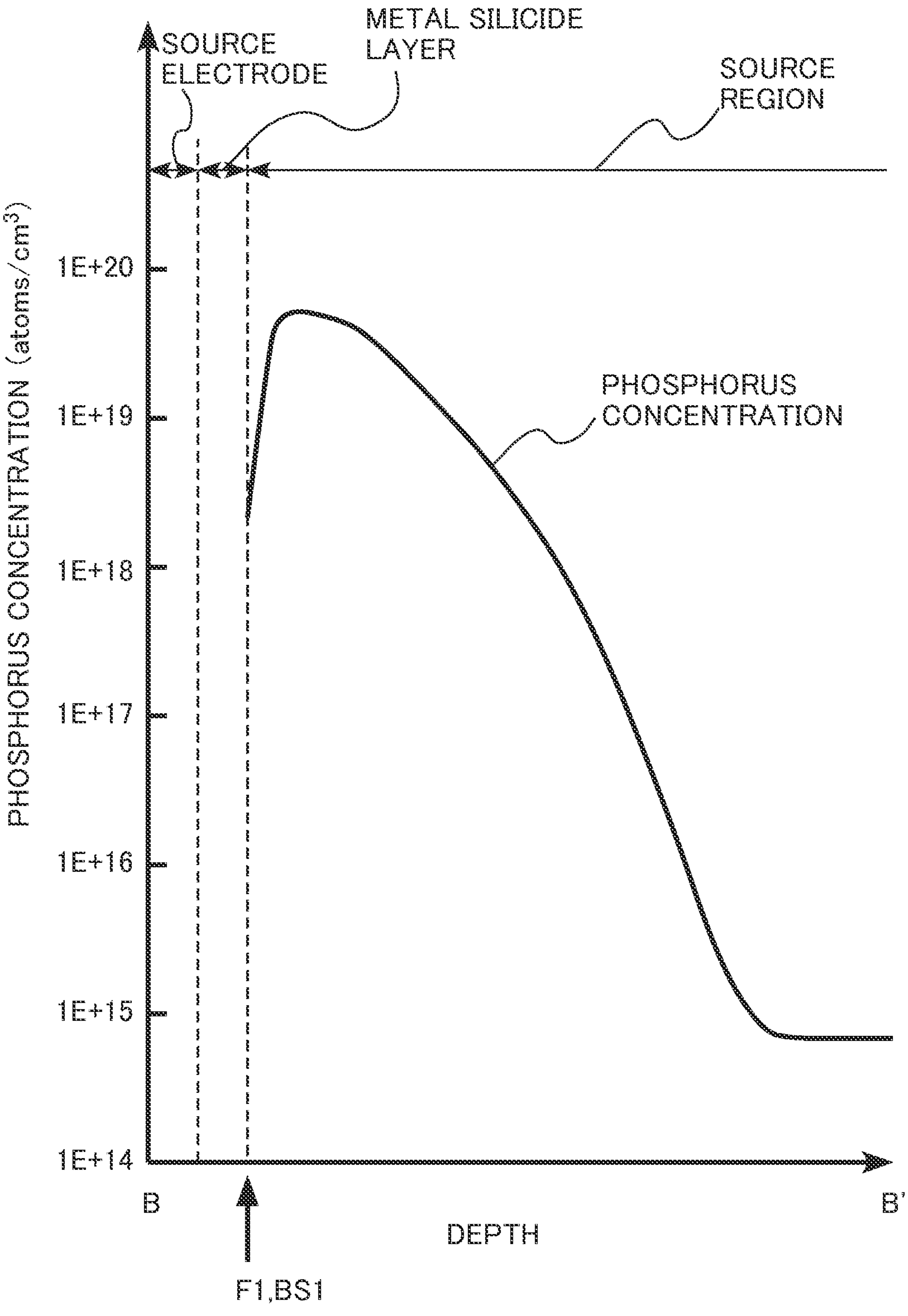
FIG. 15 is a diagram showing the distribution of the n-type impurity concentration in the semiconductor device of the comparative example.

FIG. 15 is a diagram showing the distribution of the n-type impurity concentration in the semiconductor device of the comparative example. FIG. 15 shows the distribution of the n-type impurity concentration in the depth direction of the source region 36 of the MOSFET 900. FIG. 15 shows the distribution of the n-type impurity concentration in the first direction of the source region 36 of the MOSFET 900. FIG. 15 is a diagram corresponding to FIG. 3 of the first embodiment.

FIG. 15 shows the distribution of the n-type impurity concentration in a portion along the dotted line BB' in FIG. 14. FIG. 15 shows an example in which the $n^-$ type impurity contained in the source region 36 is phosphorus (P).

The horizontal axis in FIG. 15 indicates the position of the first face F1 and the position of the first bottom surface BS1.

As shown in FIG. 15, the phosphorus concentration in the depth direction of the source region 36 once increases from the position where the source region 36 is in contact with the first bottom surface BS1 of the metal silicide layer 20 toward the drain electrode 14 and then decreases. The phosphorus concentration in the depth direction of the source region 36 does not reach its maximum at the position where the source region 36 is in contact with the first bottom surface BS1.

The source region 36 is formed by ion-implanting phosphorus (P) into the semiconductor layer 10 from the first face F1. For this reason, the phosphorus concentration in the depth direction of the source region 36 forms a distribution having a peak at a position deeper than the first face F1. Therefore, in the case of the MOSFET 900 of the comparative example in which the position of the first face F1 and the position of the first bottom surface BS1 are approximately the same, the phosphorus concentration in the depth direction of the source region 36 does not reach its maximum at the position where the source region 36 is in contact with the first bottom surface BS1.

The contact resistance between the metal silicide and the n-type semiconductor decreases as the n-type impurity concentration in the n-type semiconductor increases. This is because the width of the Schottky barrier between the metal silicide and the n-type semiconductor in contact with the metal silicide decreases as the n-type impurity concentration in the n-type semiconductor increases, and accordingly, it becomes easier for carriers to tunnel through the Schottky barrier and flow.

In the case of the MOSFET 900 of the comparative example, since the phosphorus concentration in the source region 36 at the position where the source region 36 is in contact with the metal silicide layer 20 is low, the contact resistance between the metal silicide layer 20 and the source region 36 may increase.

In the MOSFET 100 according to the first embodiment, the phosphorus concentration in the depth direction of the source region 36 monotonically decreases from the position where the source region 36 is in contact with the first bottom surface BS1 of the metal silicide layer 20 toward the drain electrode 14. In other words, the phosphorus concentration in the depth direction of the source region 36 is maximized at the position where the source region 36 is in contact with the first bottom surface BS1.

Therefore, the contact resistance between the metal silicide layer 20 and the source region 36 is reduced as compared with the MOSFET 900 of the comparative example. As a result, the on-resistance of the MOSFET 100 is reduced.

From the viewpoint of reducing the contact resistance between the metal silicide layer 20 and the source region 36, the n-type impurity concentration in the source region 36 in contact with the first bottom surface BS1 is preferably equal to or more than $2\times10^{19}$ atoms/cm$^3$, more preferably equal to or more than $3\times10^{19}$ atoms/cm$^3$, and even more preferably equal to or more than $5\times10^{19}$ atoms/cm$^3$.

From the viewpoint of reducing the contact resistance between the metal silicide layer 20 and the source region 36, the distance (d1 in FIG. 2) between the first face F1 and the first bottom surface BS1 in the first direction is preferably equal to or more than 10 nm, more preferably equal to or more than 15 nm, and even more preferably equal to or more than 20 nm.

The thickness of the metal silicide layer 20 in the first direction is preferably equal to or more than 10 nm and equal to or less than 50 nm, more preferably equal to or more than 20 nm and equal to or less than 40 nm. If the thickness of the metal silicide layer 20 in the first direction exceeds the above lower limit, the diffusion of the metal element, which is a lifetime killer, increases. Therefore, it becomes easy to reduce the switching loss. In addition, if the thickness of the metal silicide layer 20 in the first direction exceeds the above lower limit, the catalytic effect of the metal silicide layer 20 increases when etching the semiconductor layer 10 below the metal silicide layer 20. Therefore, the etching of the semiconductor layer 10 becomes easy. If the thickness of the metal silicide layer 20 in the first direction is below the above upper limit, the amount of the etchant supplied through the metal silicide layer 20 increases when etching the semiconductor layer 10 below the metal silicide layer 20. Therefore, the etching of the semiconductor layer 10 becomes easy.

In the semiconductor device manufacturing method according to the first embodiment, the second heat treatment is performed after forming the metal silicide layer 20 containing gold or a platinum group element, so that the gold or platinum group element can be diffused into the semiconductor layer 10. The gold or platinum group element functions as a lifetime killer. Therefore, it is possible to manufacture the MOSFET 100 with reduced switching loss.

In the semiconductor device manufacturing method according to the first embodiment, the source region 36 below the metal silicide layer 20 containing gold or a platinum group element is etched by using a solution containing hydrofluoric acid. By etching a portion of the surface of the source region 36 where the n-type impurity concentration is low, the phosphorus concentration in the depth direction of the source region 36 can be maximized at the position where the source region 36 is in contact with the first bottom surface BS1. Therefore, it is possible to reduce the contact resistance between the metal silicide layer 20 and the source region 36.

In the semiconductor device manufacturing method according to the first embodiment, the first heat treatment for forming the metal silicide layer 20 is performed at a temperature equal to or more than 100° C. By performing the first heat treatment at a temperature equal to or more than 100° C., it is possible to prevent the metal silicide layer 20 from becoming too thin and suppressing the progress of the etching of the semiconductor layer 10 below the metal silicide layer 20. If the metal silicide layer 20 becomes too thin, the catalytic effect of the metal silicide layer is reduced, and the progress of the etching of the semiconductor layer 10 is suppressed.

In the semiconductor device manufacturing method according to the first embodiment, the first heat treatment for forming the metal silicide layer 20 is performed at a temperature equal to or less than 550° C. By performing the first heat treatment at a temperature equal to or less than 550° C., it is possible to prevent the metal silicide layer 20 from becoming too thick and suppressing the progress of the etching of the semiconductor layer 10 below the metal silicide layer 20. If the metal silicide layer 20 becomes too thick, the amount of the etchant passing through the metal silicide layer 20 decreases, so that the progress of the etching of the semiconductor layer 10 is suppressed.

In the semiconductor device manufacturing method according to the first embodiment, since the first heat treatment for forming the metal silicide layer 20 is performed at a temperature equal to or more than 100° C. and equal to or less than 550° C., it is possible to appropriately control the progress of the etching of the semiconductor layer 10 below the metal silicide layer 20. From the viewpoint of appropriately controlling the progress of the etching of the semiconductor layer 10 below the metal silicide layer 20, the first heat treatment for forming the metal silicide layer 20 is preferably performed at a temperature equal to or more than 200° C. and equal to or less than 400° C., more preferably performed at a temperature equal to or more than 200° C. and equal to or less than 300° C.

From the viewpoint of reducing the number of manufacturing processes and reducing the manufacturing cost of the semiconductor device, it is preferable that the deposition of the first metal film and the first heat treatment are performed in the same process.

From the viewpoint of sufficiently diffusing gold or a platinum group element into the semiconductor layer the temperature of the second heat treatment is preferably equal to or more than 700° C., more preferably equal to or more than 800° C.

As described above, according to the first embodiment, a MOSFET and a MOSFET manufacturing method capable of reducing the switching loss and the on-resistance are provided.

Second Embodiment

A semiconductor device according to a second embodiment is different from the semiconductor device according to the first embodiment in that the position of the second bottom surface of the metal silicide layer in the first direction is closer to the second face than the position of the first bottom surface in the first direction. Hereinafter, the description of a part of the content overlapping the first embodiment may be omitted.

The semiconductor device according to the second embodiment is a vertical transistor. The semiconductor device according to the second embodiment is a vertical power MOSFET. The semiconductor device according to the second embodiment is a MOSFET 200. The MOSFET 200 is an re-channel MOSFET having electrons as carriers.

Figure 16:
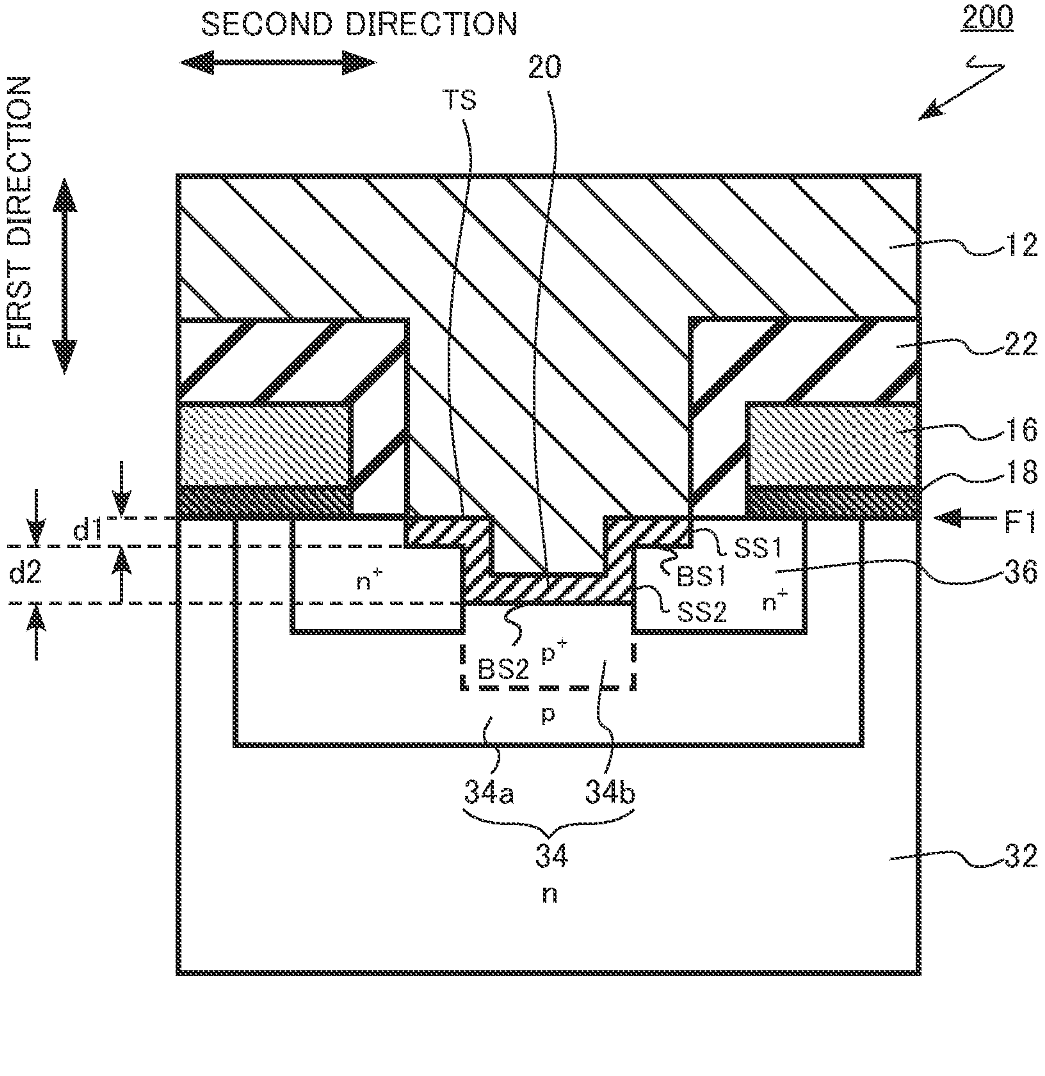
FIG. 16 is an enlarged schematic cross-sectional view of a part of a semiconductor device according to a second embodiment.

FIG. 16 is an enlarged schematic cross-sectional view of a part of the semiconductor device according to the second embodiment. FIG. 16 is a diagram corresponding to FIG. 2 of the first embodiment.

The MOSFET 200 according to the second embodiment includes a semiconductor layer 10, a source electrode 12, a drain electrode 14, a gate electrode 16, a gate insulating layer 18, a metal silicide layer 20, and an interlayer insulating layer 22.

The source electrode 12 is an example of the first electrode. The drain electrode 14 is an example of the second electrode.

The semiconductor layer 10 includes an $n^+$-type drain region 30, an n-type drift region 32, a p-type body region 34, and an $n^+$-type source region 36. The body region 34 includes a p-type low concentration region 34*a* and a $p^+$-type high concentration region 34*b*.

The drift region 32 is an example of the first semiconductor region. The body region 34 is an example of the second semiconductor region. The source region 36 is an example of the third semiconductor region.

The metal silicide layer 20 is provided between the source electrode 12 and the semiconductor layer 10.

The metal silicide layer 20 is provided between the source electrode 12 and the source region 36. The metal silicide layer 20 is in contact with the source electrode 12. The metal silicide layer 20 is in contact with the source region 36.

The metal silicide layer 20 is provided between the source electrode 12 and the body region 34. The metal silicide layer 20 is provided between the source electrode 12 and the high concentration region 34*b*. The metal silicide layer 20 is in contact with the high concentration region 34*b*.

The metal silicide layer 20 includes a top surface TS, a first bottom surface BS1, a second bottom surface BS2, a first side surface SS1, and a second side surface SS2. The top surface TS of the metal silicide layer 20 is in contact with the source electrode 12. The first bottom surface BS1, the second bottom surface BS2, the first side surface SS1, and the second side surface SS2 of the metal silicide layer 20 are in contact with the semiconductor layer 10.

The second side surface SS2 is provided between the first bottom surface BS1 and the second bottom surface BS2.

The first bottom surface BS1 of the metal silicide layer 20 is in contact with the source region 36. The second bottom surface BS2 of the metal silicide layer 20 is in contact with the high concentration region 34*b*. The first side surface SS1 of the metal silicide layer 20 is in contact with the source region 36.

At least a part of the second side surface SS2 of the metal silicide layer 20 is in contact with the source region 36. For example, the entire second side surface SS2 of the metal silicide layer 20 is in contact with the source region 36.

The position of the first bottom surface BS1 in the first direction is closer to the second face F2 than the position of the first face F1 in the first direction. The position of the first bottom surface BS1 in the first direction is closer to the second face F2 than the position of an interface between the gate insulating layer 18 and the source region 36 in the first direction. The position of the first bottom surface BS1 in the first direction is closer to the second face F2 than the position of an interface between the interlayer insulating layer 22 and the source region 36 in the first direction.

The distance from the second face F2 to the first bottom surface BS1 is smaller than the distance from the second face F2 to the first face F1. The distance from the second face F2 to the metal silicide layer 20 is smaller than the distance from the second face F2 to the gate insulating layer 18.

A distance (d1 in FIG. 16) between the first face F1 and the first bottom surface BS1 in the first direction is, for example, equal to or more than 10 nm and equal to or less than 100 nm.

The position of the second bottom surface BS2 in the first direction is closer to the second face F2 than the position of the first bottom surface BS1 in the first direction. The distance from the second face F2 to the second bottom surface BS2 is smaller than the distance from the second face F2 to the first bottom surface BS1.

A distance (d2 in FIG. 16) between the first bottom surface BS1 and the second bottom surface BS2 in the first direction is, for example, equal to or more than 30 nm and equal to or less than 300 nm.

The distance d2 between the first bottom surface BS1 and the second bottom surface BS2 in the first direction is, for example, larger than the distance d1 between the first face F1 and the first bottom surface BS1 in the first direction. The distance d2 between the first bottom surface BS1 and the second bottom surface BS2 in the first direction is, for example, equal to or more than 1.5 times the distance d1 between the first face F1 and the first bottom surface BS1 in the first direction.

The first side surface SS1 or the second side surface SS2 may have a tapered shape.

The metal silicide layer 20 contains at least one metal element selected from a group consisting of gold (Au), ruthenium (Ru), rhodium (Rh), palladium (Pd), osmium (Os), iridium (Ir), and platinum (Pt). The metal silicide layer 20 contains silicide of gold or a platinum group element.

The metal silicide layer 20 contains platinum silicide, for example. The metal silicide layer 20 is, for example, a platinum silicide layer.

Next, an example of a semiconductor device manufacturing method according to the second embodiment will be described.

The semiconductor device manufacturing method according to the second embodiment is different from the semiconductor device manufacturing method according to the first embodiment in that the semiconductor layer 10 is etched before forming the $p^+$-type high concentration region 34*b*.

FIGS. 17 to 25 are schematic cross-sectional views showing the semiconductor device according to the second embodiment during manufacturing. FIGS. 17 to 25 show cross sections corresponding to FIG. 16 of the second embodiment.

Hereinafter, a case where a first metal film is a platinum film and a second metal film is a stacked film of a titanium nitride film and an aluminum film will be described as an example. In addition, a case where the deposition of the first metal film and the first heat treatment are performed in the same process will be described as an example.

Figure 17:
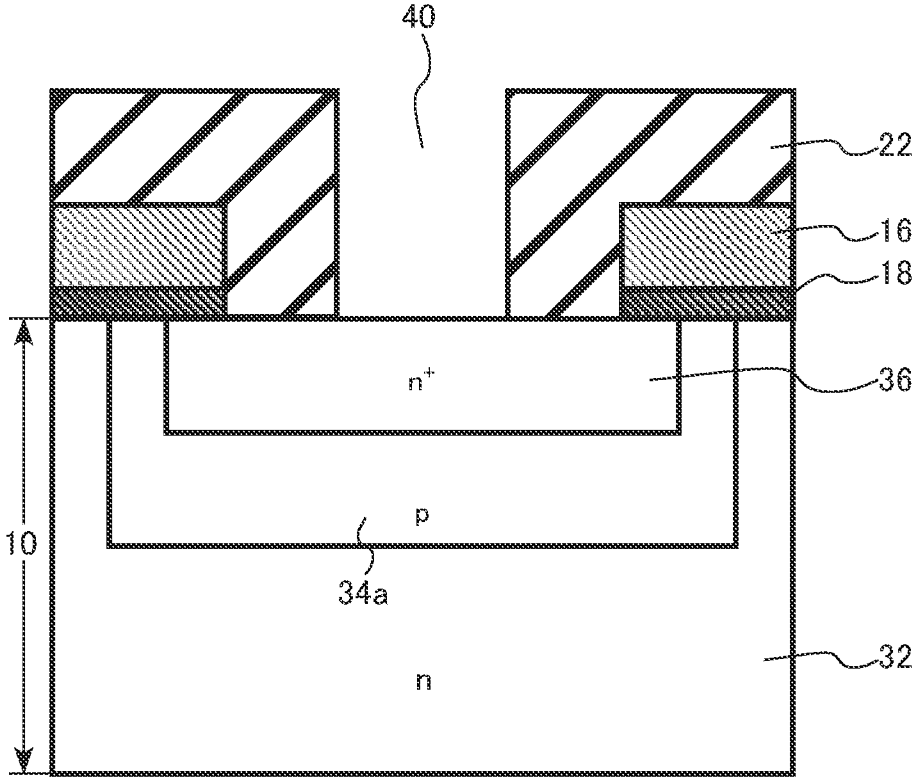
FIG. 17 is a schematic cross-sectional view of the semiconductor device according to the second embodiment during manufacturing.

The semiconductor device manufacturing method according to the second embodiment is the same as the semiconductor device manufacturing method according to the first embodiment until the opening 40 is formed in the interlayer insulating layer 22 on the source region 36 (FIG. 17). The opening 40 is formed by using, for example, a photolithographic method and an RIE method.

Figure 18:
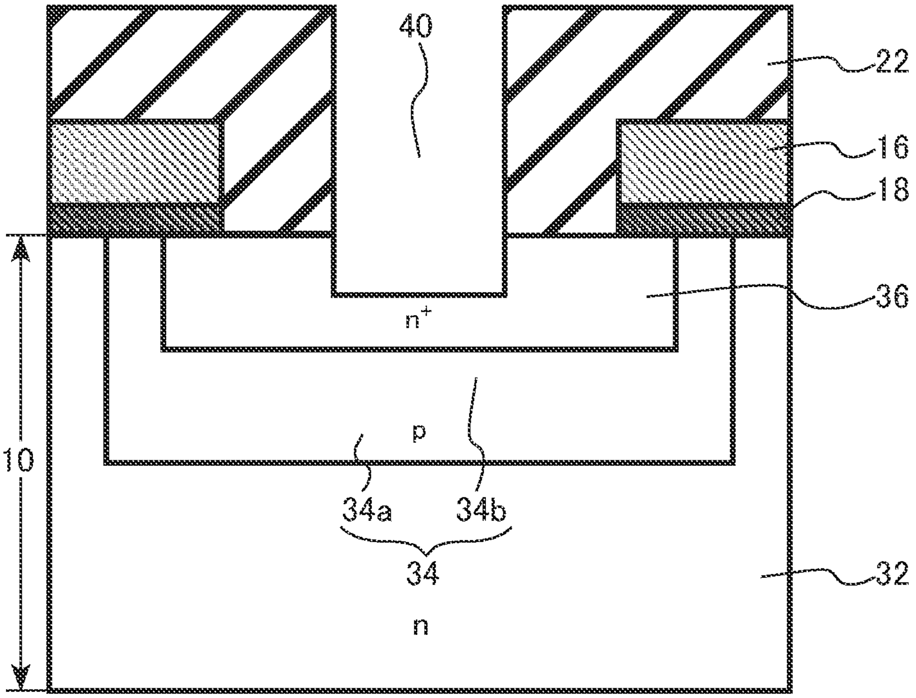
FIG. 18 is a schematic cross-sectional view of the semiconductor device according to the second embodiment during manufacturing.

Then, the semiconductor layer 10 is etched by using the interlayer insulating layer 22 as a mask material (FIG. 18). By using the interlayer insulating layer 22 as a mask material, the surface of the source region 36 is etched. By etching the surface of the source region 36, the high phosphorus concentration region on the surface of the source region 36 is removed.

For the etching of the semiconductor layer 10, for example, anisotropic etching or isotropic etching is used. For the etching of the semiconductor layer 10, for example, an RIE method or a chemical dry etching method (CDE method) is used.

Figure 19:
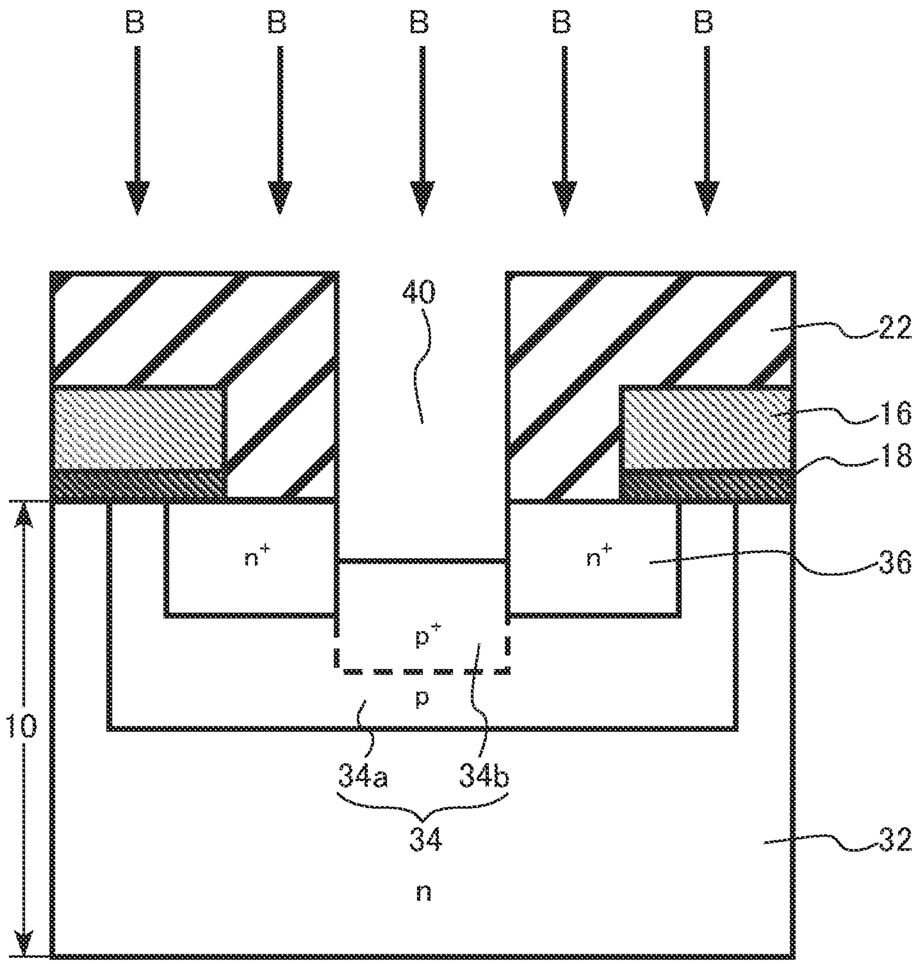
FIG. 19 is a schematic cross-sectional view of the semiconductor device according to the second embodiment during manufacturing.

Then, by using the interlayer insulating layer 22 as a mask material, boron (B), which is a p-type impurity, is ion-implanted into the semiconductor layer 10 through the opening 40 (FIG. 19). By ion-implanting boron (B) into the semiconductor layer 10, the $p^+$-type high concentration region 34*b* is formed. The high concentration region 34*b* is an example of the impurity region.

Figure 20:
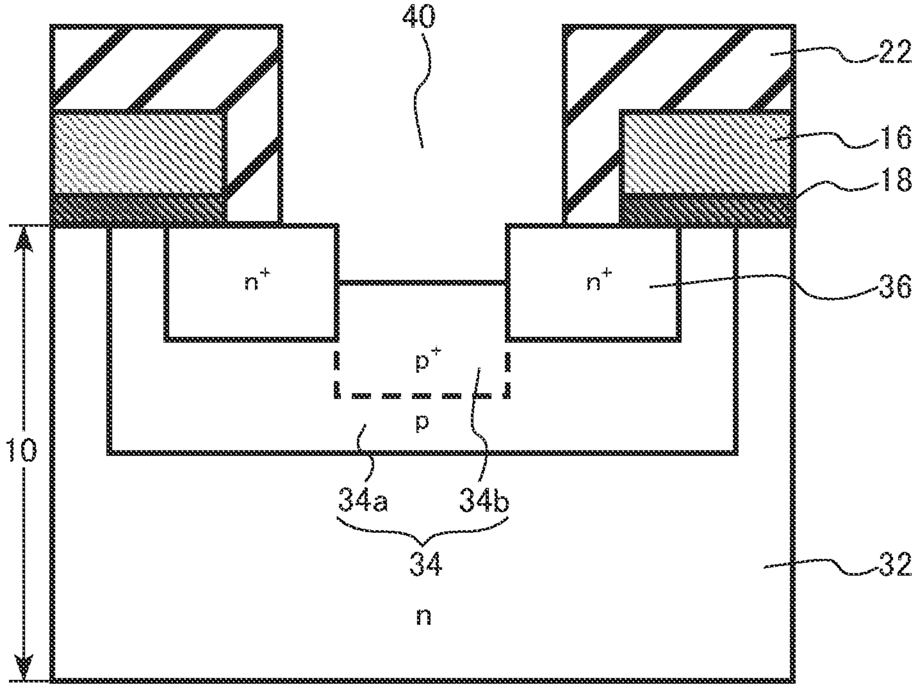
FIG. 20 is a schematic cross-sectional view of the semiconductor device according to the second embodiment during manufacturing.

Then, a part of the interlayer insulating layer 22 is removed by etching (FIG. 20). For the etching of the interlayer insulating layer 22, for example, a wet etching method is used. As an etchant for etching the interlayer insulating layer 22, for example, a solution containing hydrofluoric acid is used.

By etching a part of the interlayer insulating layer 22, the width of the opening 40 in the second direction is increased. By etching a part of the interlayer insulating layer 22, the source region 36 is exposed at the bottom of the opening 40.

Figure 21:
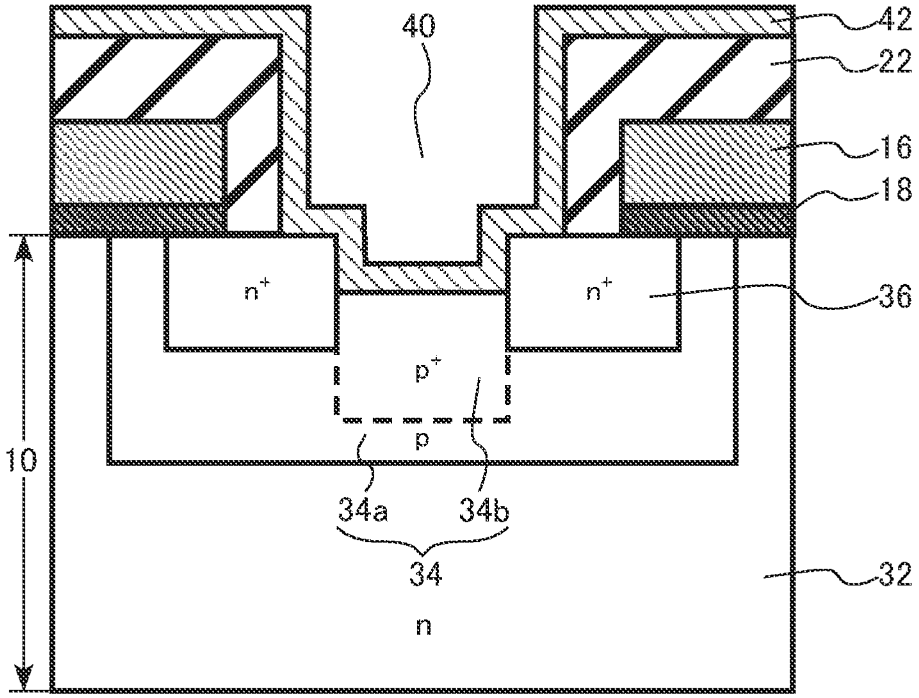
FIG. 21 is a schematic cross-sectional view of the semiconductor device according to the second embodiment during manufacturing.

Then, a platinum film 42 is deposited on the semiconductor layer 10 (FIG. 21). The platinum film 42 is an example of the first metal film. The platinum film 42 is formed by using a sputtering method, for example.

The platinum film 42 is deposited at a temperature equal to or more than 100° C. and equal to or less than 550° C. For example, when the platinum film 42 is deposited by using a sputtering method, the platinum film 42 is deposited while the temperature of the semiconductor layer is equal to or more than 100° C. and equal to or less than 550° C.

Figure 22:
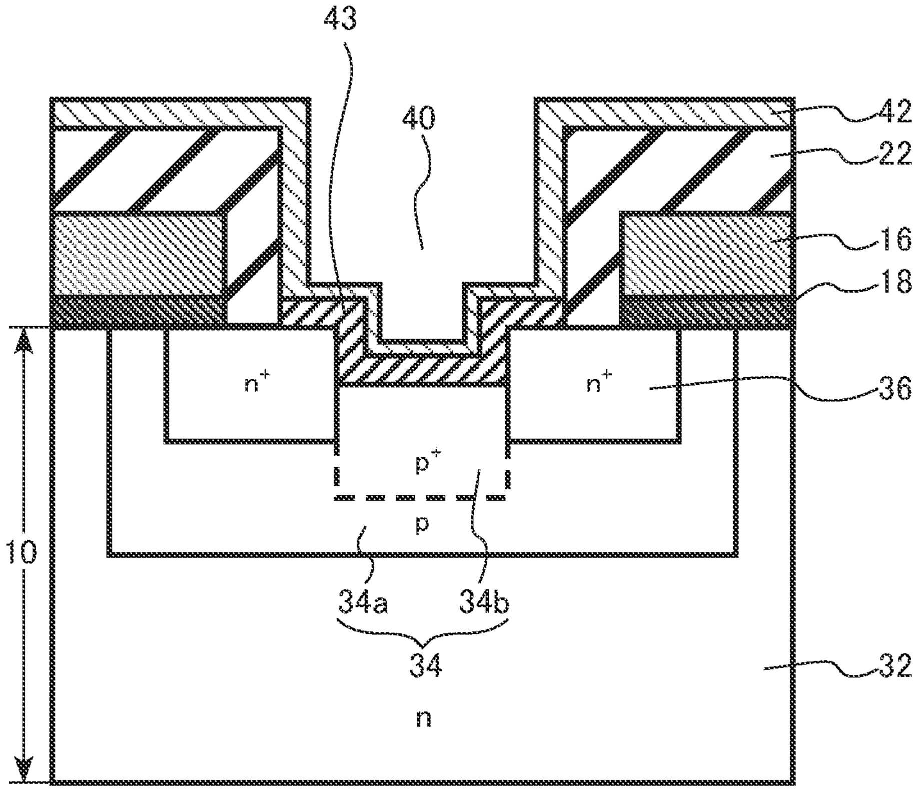
FIG. 22 is a schematic cross-sectional view of the semiconductor device according to the second embodiment during manufacturing.

The deposition of the platinum film 42 is an example of the first heat treatment. By the first heat treatment, the platinum film 42 and the semiconductor layer react with each other to form a platinum silicide layer 43 (FIG. 22). The platinum film 42 reacts with the source region 36 and the high concentration region 34*b* to form the platinum silicide layer 43. The platinum silicide layer 43 is an example of a metal silicide layer.

The deposition of the platinum film 42 and the first heat treatment may be performed as different treatments. When the deposition of the platinum film 42 and the first heat treatment are performed as different treatments, for example, the temperature for depositing the platinum film 42 is lower than the temperature for the first heat treatment.

Figure 23:
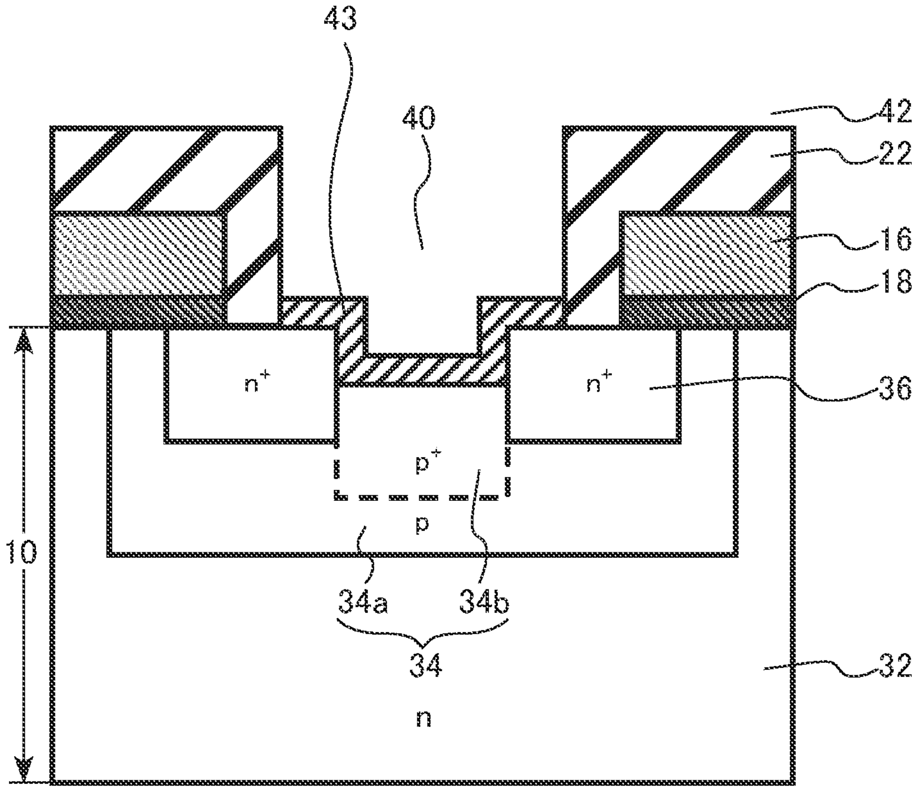
FIG. 23 is a schematic cross-sectional view of the semiconductor device according to the second embodiment during manufacturing.

Then, the unreacted platinum film 42 is removed (FIG. 23). The unreacted platinum film 42 is removed by using a solution containing aqua regia as an etching etchant.

Figure 24:
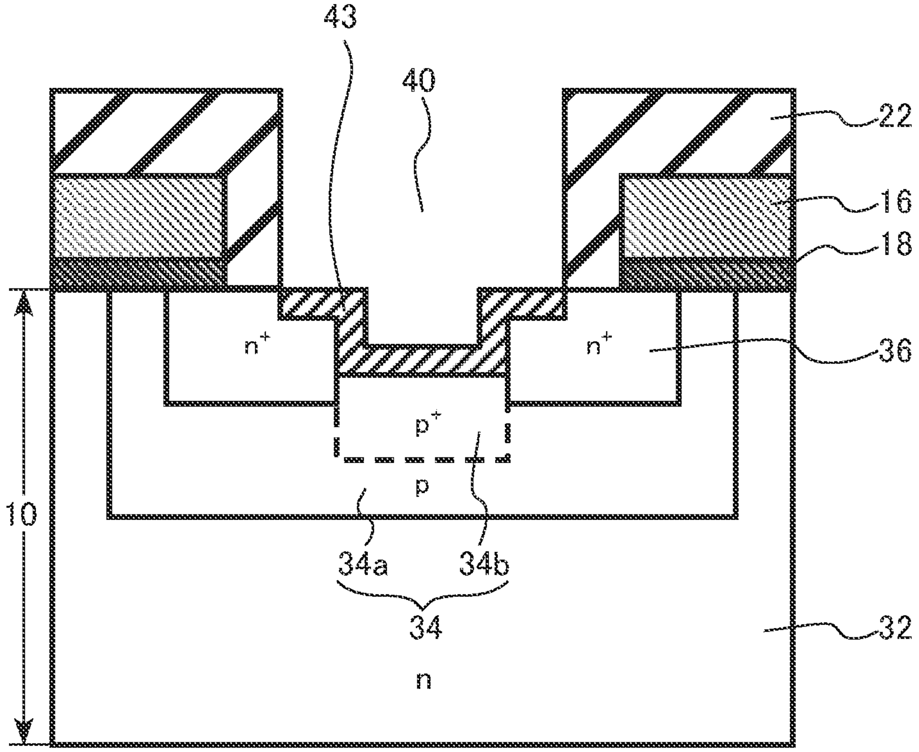
FIG. 24 is a schematic cross-sectional view of the semiconductor device according to the second embodiment during manufacturing.

Then, the semiconductor layer 10 below the platinum silicide layer 43 is etched (FIG. 24). As the etchant for etching the semiconductor layer 10, a solution containing hydrofluoric acid is used. The etching of the semiconductor layer 10 is performed by using, for example, dilute hydrofluoric acid. The etching of the semiconductor layer 10 is performed by using a so-called metal-assisted chemical etching method (MacEtch method).

Since the platinum silicide layer 43 acts as a catalyst, the semiconductor layer 10 below the platinum silicide layer 43 is selectively etched. The source region 36 and the high concentration region 34*b* below the platinum silicide layer 43 are selectively etched. By etching the semiconductor layer 10, the bottom surface of the platinum silicide layer 43 moves toward the second face F2 as shown in FIG. 24.

When the semiconductor layer 10 below the platinum silicide layer 43 is etched, the bottom surface of the platinum silicide layer 43 is etched up to a depth exceeding the peak position of the distribution of the n-type impurity concentration in the source region 36. The etching amount of the semiconductor layer 10 can be controlled, for example, by controlling the etching time.

Then, a second heat treatment is performed at a temperature higher than that of the first heat treatment. By the second heat treatment, platinum (Pt) contained in the platinum silicide layer 43 is diffused into the semiconductor layer 10.

The temperature of the second heat treatment is, for example, equal to or more than 700° C. and equal to or less than 900° C. The second heat treatment is performed, for example, in a non-oxidizing atmosphere. The second heat treatment is performed, for example, in a nitrogen atmosphere or an argon atmosphere.

Figure 25:
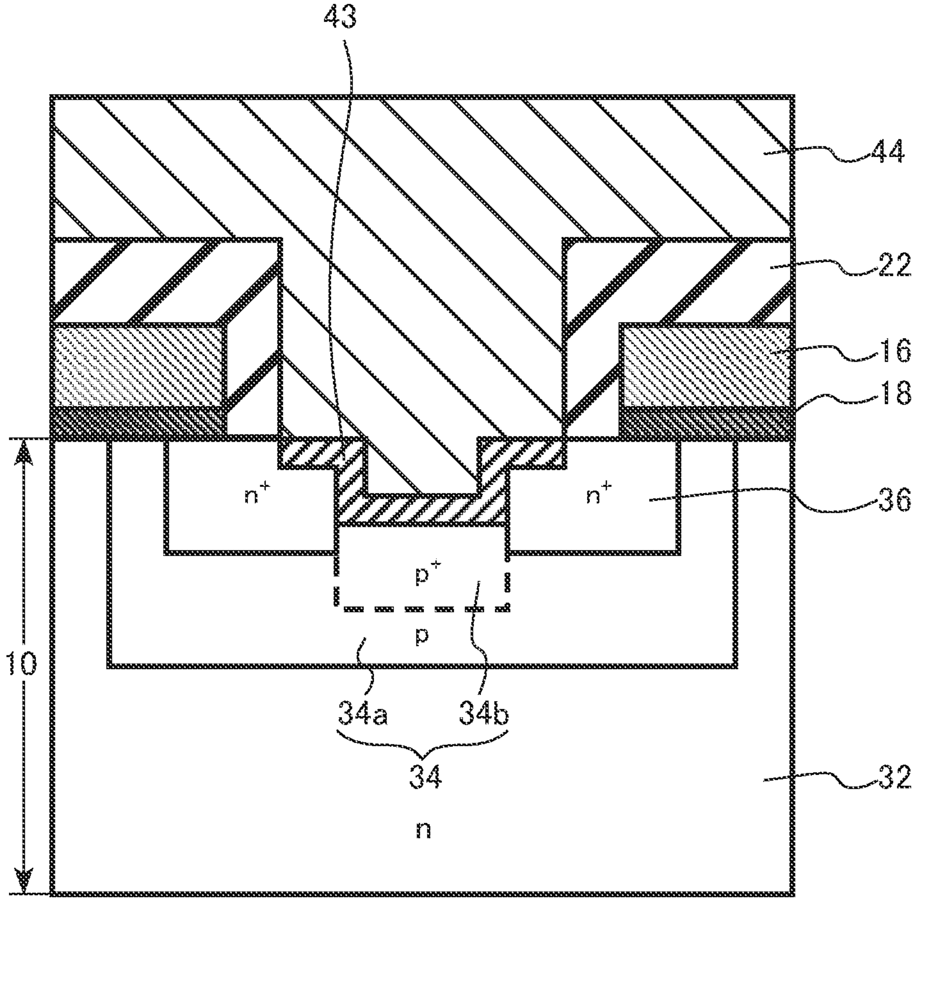
FIG. 25 is a schematic cross-sectional view of the semiconductor device according to the second embodiment during manufacturing.

Then, a stacked film 44 of a titanium nitride film and an aluminum film is deposited on the platinum silicide layer 43 (FIG. 25). The stacked film 44 is an example of the second metal film. The stacked film 44 finally becomes the source electrode 12.

Then, the drain electrode 14 is formed on the second face F2 side of the semiconductor layer 10 by using a known process technique.

By the manufacturing method described above, the MOSFET 200 according to the second embodiment shown in FIG. 16 is manufactured.

In the MOSFET 200 according to the second embodiment, since the semiconductor layer 10 contains gold or a platinum group element, the switching loss is reduced as in the MOSFET 100 according to the first embodiment.

In addition, since the MOSFET 200 according to the second embodiment includes the second side surface SS2, the contact area between the metal silicide layer 20 and the source region 36 is increased. Therefore, it is possible to further reduce the contact resistance between the metal silicide layer 20 and the source region 36. As a result, the on-resistance of the MOSFET 200 is further reduced.

In addition, in the MOSFET 200 according to the second embodiment, since the second bottom surface BS2 is located deeper than the first bottom surface BS1, the p-type impurity concentration at the position where the high concentration region 34*b* is in contact with the second bottom surface BS2 can be made to be higher than that in the MOSFET 100 according to the first embodiment. For this reason, it is possible to reduce the contact resistance between the metal silicide layer 20 and the high concentration region 34*b*.

Therefore, for example, when an avalanche breakdown occurs in the MOSFET 200, the extraction of holes from the high concentration region 34*b* to the source electrode 12 is promoted. As a result, the avalanche resistance of the MOSFET 200 is improved.

Modification Example

A semiconductor device of a modification example of the second embodiment is different from the semiconductor device according to the second embodiment in that at least a part of the second side surface SS2 is in contact with the $p^+$-type high concentration region 34*b*.

Figure 26:
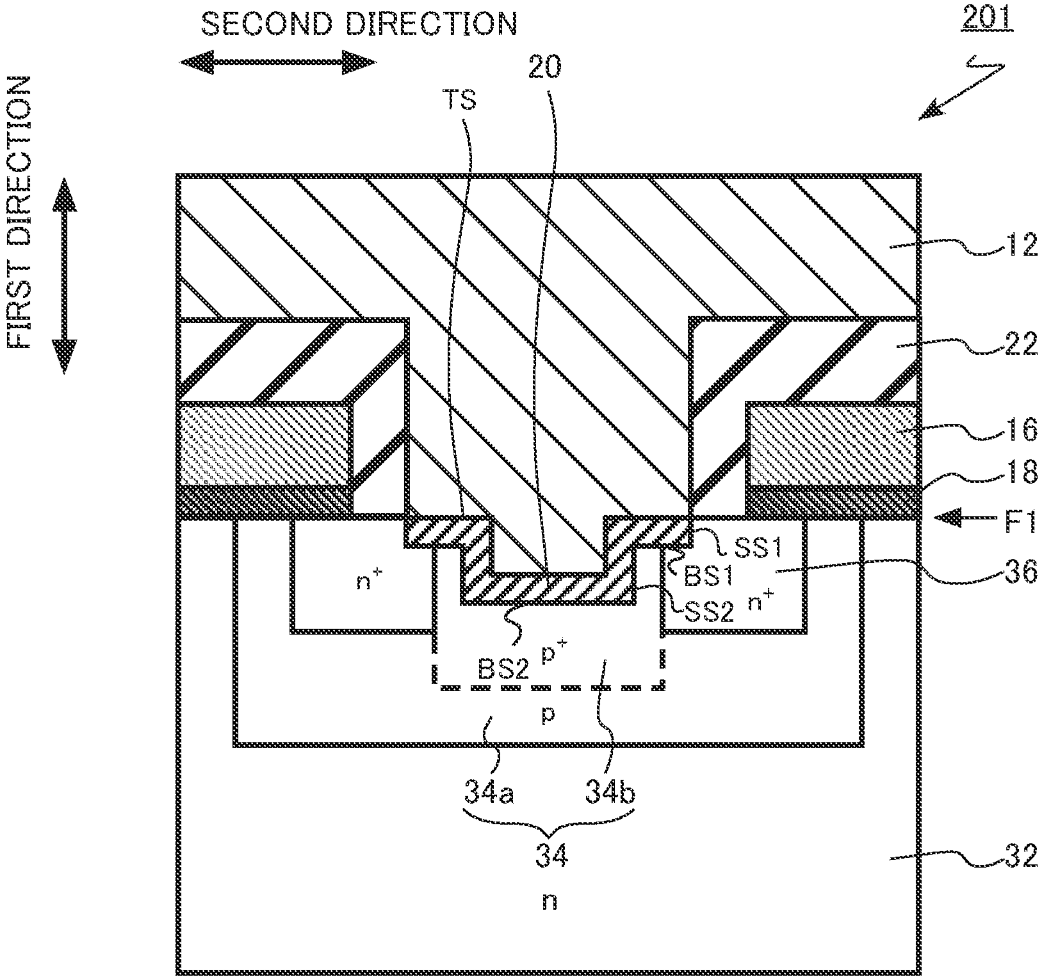
FIG. 26 is an enlarged schematic cross-sectional view of a part of a semiconductor device of a modification example of the second embodiment.

FIG. 26 is an enlarged schematic cross-sectional view of a part of the semiconductor device of the modification example of the second embodiment. FIG. 26 is a diagram corresponding to FIG. 16 of the second embodiment.

In a MOSFET 201 of the modification example of the second embodiment, at least a part of the second side surface SS2 is in contact with the $p^+$-type high concentration region 34*b*. For example, the entire second side surface SS2 is in contact with the high concentration region 34*b*.

In the MOSFET 201 of the modification example of the second embodiment, since at least a part of the second side surface SS2 is in contact with the high concentration region 34*b*, the contact area between the metal silicide layer 20 and the high concentration region 34*b* is increased. Therefore, it is possible to further reduce the contact resistance between the metal silicide layer 20 and the high concentration region 34*b*. As a result, the MOSFET 201 of the modification example of the second embodiment has improved avalanche resistance compared with, for example, the MOSFET 200 according to the second embodiment.

As described above, according to the second embodiment and its modified example, a MOSFET and a MOSFET manufacturing method capable of reducing the switching loss and the on-resistance are provided.

Third Embodiment

A semiconductor device according to a third embodiment is different from the semiconductor device according to the first embodiment in that a p-type pillar region disposed between the p-type body region and the second face is further provided in the semiconductor layer. Hereinafter, the description of a part of the content overlapping the first embodiment may be omitted.

The semiconductor device according to the third embodiment is a vertical transistor. The semiconductor device according to the third embodiment is a vertical power MOSFET. The semiconductor device according to the third embodiment is a MOSFET 300. The MOSFET 300 is an re-channel MOSFET having electrons as carriers. The MOSFET 300 is a MOSFET having a so-called super junction structure. The MOSFET 300 has a contact structure similar to the MOSFET 100 according to the first embodiment.

Figure 27:
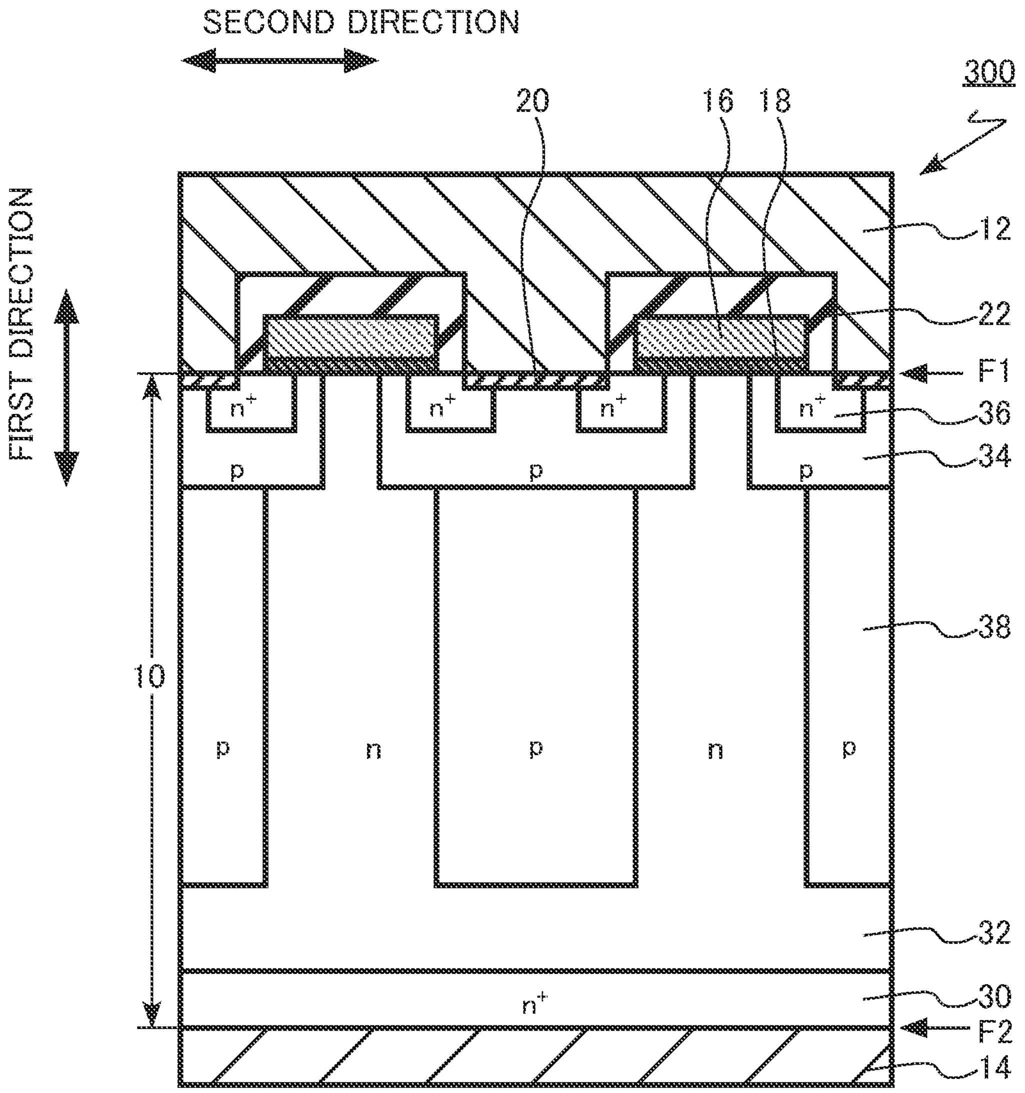
FIG. 27 is a schematic cross-sectional view of a semiconductor device according to a third embodiment.

FIG. 27 is a schematic cross-sectional view of the semiconductor device of the third embodiment. FIG. 27 is a diagram corresponding to FIG. 1 of the first embodiment.

The MOSFET 300 according to the third embodiment includes a semiconductor layer 10, a source electrode 12, a drain electrode 14, a gate electrode 16, a gate insulating layer 18, a metal silicide layer 20, and an interlayer insulating layer 22.

The source electrode 12 is an example of the first electrode. The drain electrode 14 is an example of the second electrode.

The semiconductor layer 10 includes an $n^+$-type drain region 30, an n-type drift region 32, a p-type body region 34, an $n^+$-type source region 36, and a p-type pillar region 38.

The drift region 32 is an example of the first semiconductor region. The body region 34 is an example of the second semiconductor region. The source region 36 is an example of the third semiconductor region.

The p-type pillar region 38 is provided between the body region 34 and the second face F2. The pillar region 38 is in contact with the body region 34. The pillar region 38 is provided between the body region 34 and the drain region 30.

The pillar region 38 is repeatedly arranged in the second direction. The drift region 32 is interposed between two pillar regions 38 adjacent to each other. The MOSFET 300 has a so-called super junction structure, which is a structure in which a p-type impurity region and an n-type impurity region are repeatedly arranged in the second direction.

The pillar region 38 contains p-type impurities. The p-type impurity is, for example, boron (B). The p-type impurity concentration in the pillar region 38 is, for example, equal to or more than $1\times10^{16}$ atoms/cm$^3$ and equal to or less than $1\times10^{18}$ atoms/cm$^3$.

In the MOSFET 300 according to the third embodiment, since the semiconductor layer 10 contains gold or a platinum group element, the switching loss is reduced as in the MOSFET 100 according to the first embodiment.

In addition, in the MOSFET 300 according to the third embodiment, the contact resistance between the metal silicide layer 20 and the source region 36 is reduced, as in the MOSFET 100 according to the first embodiment. Therefore, the on-resistance of the MOSFET 300 is reduced.

In addition, since the MOSFET 300 according to the third embodiment has a super junction structure, it is possible to improve the dielectric breakdown voltage and further reduce the on-resistance.

As described above, according to the third embodiment, a MOSFET and a MOSFET manufacturing method capable of reducing the switching loss and the on-resistance are provided.

Fourth Embodiment

A semiconductor device according to a fourth embodiment is different from the semiconductor device according to the first embodiment in that the gate electrode is disposed in a trench provided in the semiconductor layer. Hereinafter, the description of a part of the content overlapping the first embodiment may be omitted.

The semiconductor device according to the fourth embodiment is a vertical transistor. The semiconductor device according to the fourth embodiment is a vertical power MOSFET. The semiconductor device according to the fourth embodiment is a MOSFET 400. The MOSFET 400 is an re-channel MOSFET having electrons as carriers. The MOSFET 400 is a MOSFET having a trench gate structure in which the gate electrode is disposed in the trench. The MOSFET 400 has a contact structure similar to the MOSFET 100 according to the first embodiment.

Figure 28:
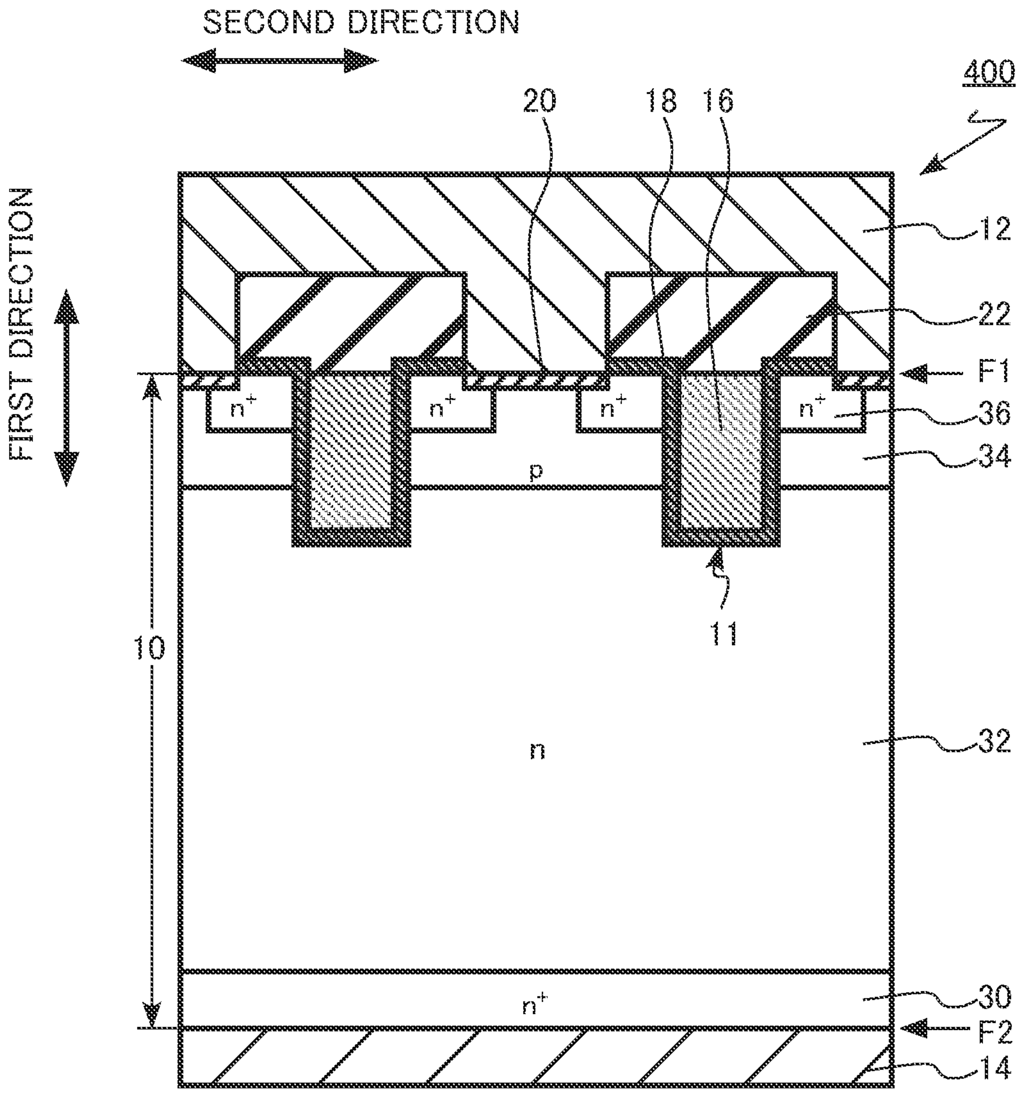
FIG. 28 is a schematic cross-sectional view of a semiconductor device according to a fourth embodiment.

FIG. 28 is a schematic cross-sectional view of the semiconductor device according to the fourth embodiment. FIG. 28 is a diagram corresponding to FIG. 1 of the first embodiment.

The MOSFET 400 according to the fourth embodiment includes a semiconductor layer 10, a source electrode 12, a drain electrode 14, a gate electrode 16, a gate insulating layer 18, a metal silicide layer 20, and an interlayer insulating layer 22.

The source electrode 12 is an example of the first electrode. The drain electrode 14 is an example of the second electrode.

The semiconductor layer 10 includes a trench 11, an $n^+$-type drain region 30, an n-type drift region 32, a p-type body region 34, and an $n^+$-type source region 36.

The drift region 32 is an example of the first semiconductor region. The body region 34 is an example of the second semiconductor region. The source region 36 is an example of the third semiconductor region.

The trench 11 is provided on the first face F1 side of the semiconductor layer 10. The trench 11 is a groove formed in the semiconductor layer 10.

The gate electrode 16 is provided in the trench 11. The gate electrode 16 faces the body region 34. The gate electrode 16 faces the drift region 32. The gate electrode 16 faces the source region 36.

The gate electrode 16 is a conductor. The gate electrode 16 is, for example, polycrystalline silicon containing n-type impurities or p-type impurities.

The gate insulating layer 18 is provided in the trench 11. The gate insulating layer 18 is provided between the gate electrode 16 and the semiconductor layer. The gate insulating layer 18 is provided between the gate electrode 16 and the body region 34. The gate insulating layer 18 is provided between the gate electrode 16 and the drift region 32. The gate insulating layer 18 is provided between the gate electrode 16 and the source region 36.

The gate insulating layer 18 is an insulator. The gate insulating layer 18 is, for example, a silicon oxide.

In the MOSFET 400 according to the fourth embodiment, since the semiconductor layer 10 contains gold or a platinum group element, the switching loss is reduced as in the MOSFET 100 according to the first embodiment. In addition, in the MOSFET 400 according to the fourth embodiment, the contact resistance between the metal silicide layer 20 and the source region 36 is reduced, as in the MOSFET 100 according to the first embodiment. Therefore, the on-resistance of the MOSFET 400 is reduced. In addition, since the MOSFET 400 according to the fourth embodiment has a gate trench structure, the on-resistance per unit area is reduced. Therefore, the on-resistance of the MOSFET 400 according to the fourth embodiment is further reduced.

As described above, according to the fourth embodiment, a MOSFET and a MOSFET manufacturing method capable of reducing the switching loss and the on-resistance are provided.

As described above, in the first to fourth embodiments, the case where the semiconductor layer is silicon has been described as an example. However, the semiconductor layer may be silicon carbide (SiC), for example.

In addition, in the first to fourth embodiments, the case where the metal element contained in the metal silicide layer is platinum (Pt) has been described as an example. However, as long as the metal element is at least one metal element selected from a group consisting of gold (Au), ruthenium (Ru), rhodium (Rh), palladium (Pd), osmium (Os), iridium (Ir), and platinum (Pt), effects similar to those of the first to fourth embodiments can be achieved.

While certain embodiments have been described, these embodiments have been presented by way of example only, and are not intended to limit the scope of the inventions. Indeed, the semiconductor device and the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:

a first electrode;

a second electrode;

a semiconductor layer provided between the first electrode and the second electrode, having a first face facing the first electrode and a second face facing the second electrode, and containing silicon (Si);
a first semiconductor region of n-type provided in the semiconductor layer;
a second semiconductor region of p-type provided in the semiconductor layer and disposed between the first semiconductor region of n-type and the first face;
a third semiconductor region of n-type provided in the semiconductor layer and disposed between the second semiconductor region of p-type and the first face;
a gate electrode provided on the first face side of the semiconductor layer and facing the second semiconductor region of p-type;
a gate insulating layer provided between the second semiconductor region of p-type and the gate electrode; and
a metal silicide layer provided between the first electrode and the second semiconductor region of p-type and between the first electrode and the third semiconductor region of n-type, including a top surface in contact with the first electrode, a first bottom surface in contact with the third semiconductor region of n-type, and a first side surface in contact with the third semiconductor region of n-type, and containing at least one metal element selected from a group consisting of gold (Au), ruthenium (Ru), rhodium (Rh), palladium (Pd), osmium (Os), iridium (Ir), and platinum (Pt),
wherein, in a first direction from the first electrode toward the second electrode, an n-type impurity concentration in the third semiconductor region of n-type monotonically decreases from the first bottom surface toward the second electrode,
the first semiconductor region of n-type contains the at least one metal element,
the semiconductor layer is single crystal silicon (Si), and
a thickness of the metal silicide layer in the first direction is equal to or more than 10 nm and equal to or less than 40 nm.

2. The semiconductor device according to claim 1,
wherein a position of the first bottom surface in the first direction is closer to the second face than a position of the first face in the first direction.

3. The semiconductor device according to claim 2,
wherein a distance between the first face and the first bottom surface in the first direction is equal to or more than 10 nm and equal to or less than 100 nm.

4. The semiconductor device according to claim 2,
wherein the metal silicide layer further includes a second bottom surface in contact with the second semiconductor region of p-type, and
a position of the second bottom surface in the first direction is closer to the second face than a position of the first bottom surface in the first direction.

5. The semiconductor device according to claim 4,
wherein a distance between the first bottom surface and the second bottom surface in the first direction is larger than a distance between the first face and the first bottom surface in the first direction.

6. The semiconductor device according to claim 4,
wherein the metal silicide layer further includes a second side surface disposed between the first bottom surface and the second bottom surface, at least a part of the second side surface being in contact with the third semiconductor region of n-type.

7. The semiconductor device according to claim 4,
wherein the metal silicide layer further includes a second side surface disposed between the first bottom surface and the second bottom surface, at least a part of the second side surface being in contact with the second semiconductor region of p-type.

8. The semiconductor device according to claim 1,
wherein the n-type impurity concentration in the third semiconductor region of n-type at a position in contact with the first bottom surface is equal to or more than $2\times10^{19}$ atoms/cm$^3$ and equal to or less than $1\times10^{21}$ atoms/cm$^3$.

* * * * *